(12) United States Patent
Oxland

(10) Patent No.: US 10,276,660 B2
(45) Date of Patent: Apr. 30, 2019

(54) NANOWIRE FIELD EFFECT TRANSISTOR HAVING A METAL GATE SURROUNDING SEMICONDUCTOR NANOWIRE

(71) Applicant: TAIWAN SEMICONDUCTOR MANUFACTURING CO., LTD., Hsinchu (TW)

(72) Inventor: Richard Kenneth Oxland, Brussels (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 15/896,269

(22) Filed: Feb. 14, 2018

(65) Prior Publication Data

US 2018/0174821 A1    Jun. 21, 2018

Related U.S. Application Data

(60) Continuation of application No. 15/286,679, filed on Oct. 6, 2016, now Pat. No. 9,911,599, which is a
(Continued)

(51) Int. Cl.
*H01L 29/06* (2006.01)
*H01L 29/10* (2006.01)
(Continued)

(52) U.S. Cl.
CPC .......... *H01L 29/0669* (2013.01); *B82Y 10/00* (2013.01); *B82Y 40/00* (2013.01); *H01L 21/0245* (2013.01); *H01L 21/0254* (2013.01); *H01L 21/02458* (2013.01); *H01L 21/02532* (2013.01); *H01L 21/28575* (2013.01);
(Continued)

(58) Field of Classification Search
CPC ......... H01L 29/66545; H01L 29/66871; H01L 29/0669; H01L 29/0673; H01L 29/785; H01L 27/0886; H01L 27/0924; H01L 27/10826; H01L 27/10879; H01L 27/1211; H01L 29/41791; H01L 29/66795; H01L 29/7831
See application file for complete search history.

(56) References Cited

U.S. PATENT DOCUMENTS 7,075,161 B2   7/2006   Barth
8,324,699 B2   12/2012  Ichijo et al.
(Continued)

OTHER PUBLICATIONS

Chinese Office Action issued in corresponding Chinese Application No. 201410369345.4, dated Mar. 3, 2017.
(Continued)

*Primary Examiner* — Michael Jung
(74) *Attorney, Agent, or Firm* — McDermott Will & Emery LLP

(57) ABSTRACT

A device includes a substrate, a buffer layer, a nanowire, a gate structure, and a remnant of a sacrificial layer. The buffer layer is above the substrate. The nanowire is above the buffer layer and includes a pair of source/drain regions and a channel region between the source/drain regions. The gate structure surrounds the channel region. The remnant of the sacrificial layer is between the buffer layer and the nanowire and includes a group III-V semiconductor material.

19 Claims, 20 Drawing Sheets

ETCH LAYER REMOVED

ETCH LAYER NOT REMOVED

Related U.S. Application Data continuation of application No. 14/821,884, filed on Aug. 10, 2015, now Pat. No. 9,472,618, which is a division of application No. 14/101,715, filed on Dec. 10, 2013, now Pat. No. 9,136,332.

(51) Int. Cl.

| | | |
|---|---|---|
| H01L 29/78 | (2006.01) | |
| H01L 29/66 | (2006.01) | |
| B82Y 10/00 | (2011.01) | |
| B82Y 40/00 | (2011.01) | |
| H01L 29/423 | (2006.01) | |
| H01L 29/775 | (2006.01) | |
| H01L 21/02 | (2006.01) | |
| H01L 21/285 | (2006.01) | |
| H01L 29/165 | (2006.01) | |
| H01L 29/20 | (2006.01) | |
| H01L 29/205 | (2006.01) | |
| H01L 29/49 | (2006.01) | |
| H01L 29/51 | (2006.01) | |
| H01L 29/786 | (2006.01) | |
| H01L 29/16 | (2006.01) | |
| H01L 21/762 | (2006.01) | |
| H01L 27/088 | (2006.01) | |
| H01L 27/092 | (2006.01) | |
| H01L 27/108 | (2006.01) | |
| H01L 27/12 | (2006.01) | |
| H01L 29/417 | (2006.01) | |
| H01L 29/08 | (2006.01) | |

(52) U.S. Cl.
CPC .... *H01L 21/76224* (2013.01); *H01L 29/0649* (2013.01); *H01L 29/0673* (2013.01); *H01L 29/1033* (2013.01); *H01L 29/1079* (2013.01); *H01L 29/16* (2013.01); *H01L 29/165* (2013.01); *H01L 29/20* (2013.01); *H01L 29/2003* (2013.01); *H01L 29/205* (2013.01); *H01L 29/42376* (2013.01); *H01L 29/42392* (2013.01); *H01L 29/495* (2013.01); *H01L 29/51* (2013.01); *H01L 29/66439* (2013.01); *H01L 29/66522* (2013.01); *H01L 29/66545* (2013.01); *H01L 29/66606* (2013.01); *H01L 29/66742* (2013.01); *H01L 29/66871* (2013.01); *H01L 29/66977* (2013.01); *H01L 29/775* (2013.01); *H01L 29/785* (2013.01); *H01L 29/7848* (2013.01); *H01L 29/78681* (2013.01); *H01L 29/78696* (2013.01); *H01L 27/0886* (2013.01); *H01L 27/0924* (2013.01); *H01L 27/10879* (2013.01); *H01L 27/1211* (2013.01); *H01L 29/0886* (2013.01); *H01L 29/41791* (2013.01); *H01L 2029/7858* (2013.01)

(56) References Cited

U.S. PATENT DOCUMENTS

| | | |
|---|---|---|
| 8,426,728 B2 | 4/2013 | Zhao et al. |
| 8,541,274 B1 | 9/2013 | Xie et al. |
| 8,580,634 B1 | 11/2013 | Xie et al. |
| 2006/0216897 A1 | 9/2006 | Lee et al. |
| 2012/0007051 A1 | 1/2012 | Bangsaruntip et al. |
| 2012/0068150 A1 | 3/2012 | Bangsaruntip et al. |
| 2012/0228682 A1 | 9/2012 | Yoshida |
| 2013/0112938 A1 | 5/2013 | Bangsaruntip et al. |
| 2013/0270512 A1 | 10/2013 | Radosavljevic et al. |
| 2013/0341704 A1* | 12/2013 | Rachmady ........ H01L 29/66545 257/327 |
| 2014/0084370 A1 | 3/2014 | Cappellani et al. |
| 2014/0175515 A1 | 6/2014 | Then et al. |
| 2014/0197370 A1 | 7/2014 | Leobandung |
| 2014/0225065 A1* | 8/2014 | Rachmady ........ H01L 29/42392 257/24 |
| 2014/0225169 A1* | 8/2014 | Suk ................ H01L 29/42392 257/288 |
| 2014/0353731 A1 | 12/2014 | Colinge et al. |
| 2015/0021715 A1 | 1/2015 | Chang et al. |
| 2015/0028389 A1 | 1/2015 | Chen et al. |
| 2015/0069473 A1* | 3/2015 | Glass ................ H01L 21/02175 257/288 |
| 2015/0104918 A1* | 4/2015 | Liu ................ H01L 29/42392 438/283 |
| 2015/0108573 A1* | 4/2015 | Liu ................ H01L 21/823487 257/347 |
| 2015/0129934 A1 | 5/2015 | Xie et al. |
| 2015/0145042 A1 | 5/2015 | Bu et al. |
| 2016/0233317 A1* | 8/2016 | Yin ................ H01L 29/66439 |

OTHER PUBLICATIONS

Eijkel, C.J.M., Branebjerg, J., Elwenspoek, M., Van De Pol, F.C.M.; A New Technology for Micromachining of Silicon: Dopant Selective HF Anodic Etching for the Realization of Low-Doped Monocrystalline Silicon Structures; EEE Electron Device Letters, 11(12); pp. 588-589; 1990.

Gong, Xiao, Zhu, Zhu, Kong, Eugene, Cheng, Ran, Subramanian, Sujith, Goh, Kian Hui, Yeo, Yee-Chia; Ultra-Thin-Body In0.7Ga0.3As-on-Nothing N-MOSFET with Pd—InGaAs Source/Drain Contacts Enabled by a New Self-Aligned Cavity Formation Technology; International Symposium on VLSI Technology, Systems, and Applications; Apr. 2012.

Definition of suspended (n.d.) American Heritage Dictionary of the English Language, Fifth Edition. (2011). Retrieved Nov. 5, 2015 from http://www.thefreedictionary.com/suspended.

Non-Final Office Action issued in U.S. Appl. No. 15/286,679, dated Apr. 27, 2017.

Final Office Action issued in U.S. Appl. No. 15/286,679, dated Aug. 10, 2017.

Notice of Allowance issued in U.S. Appl. No. 15/286,679, dated Oct. 24, 2017.

\* cited by examiner

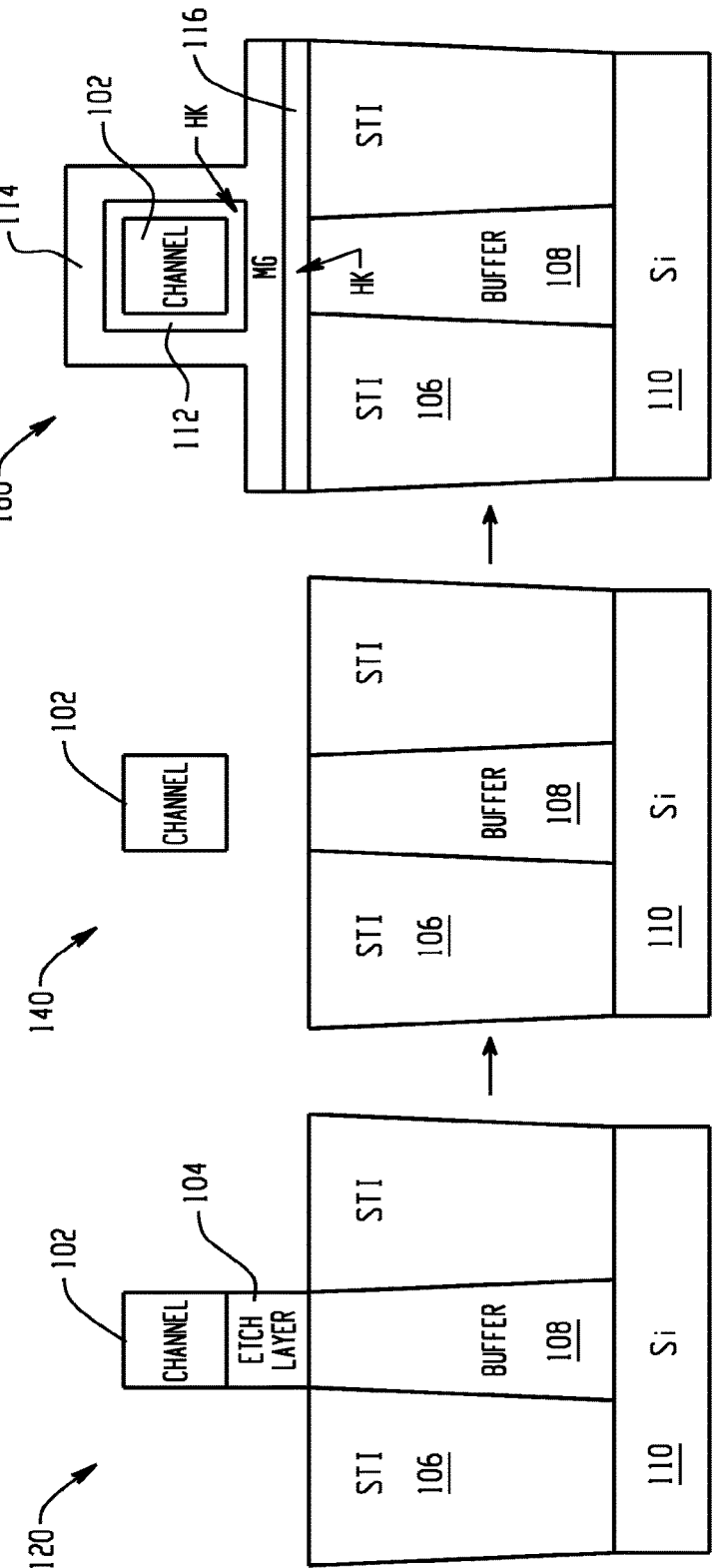

EXTENSION CROSS-SECTION

GATE CROSS-SECTION

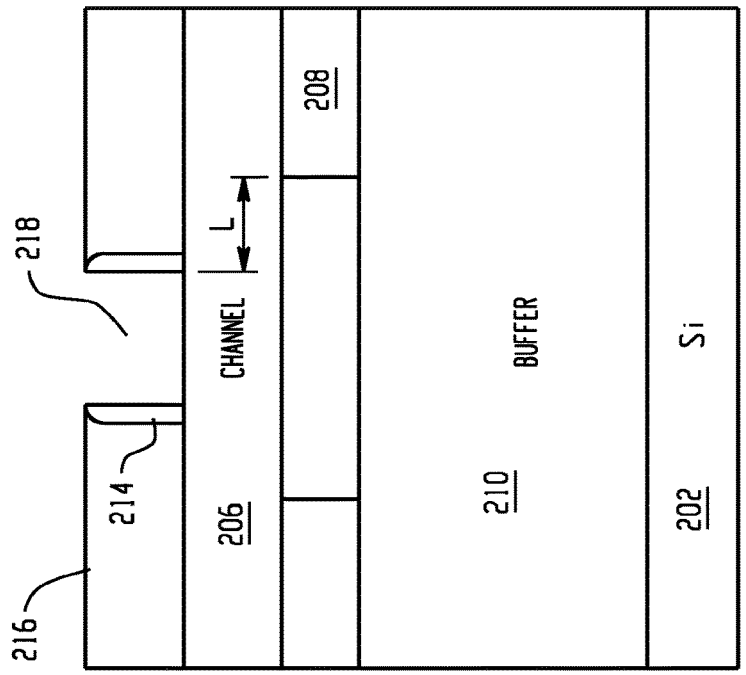
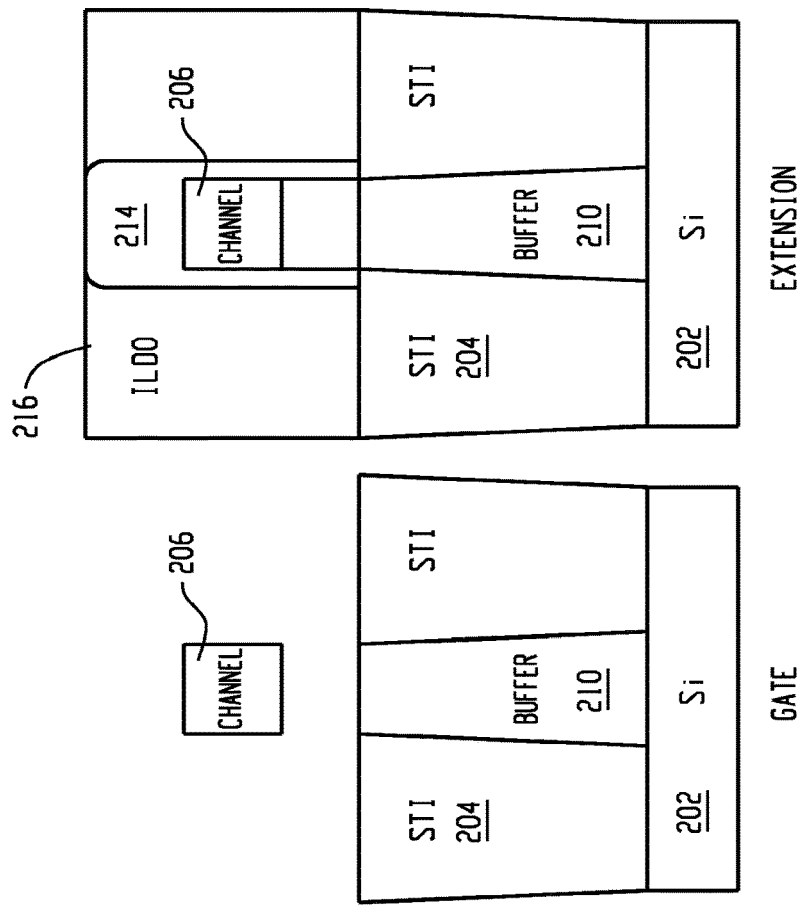
Fig. 18
Fig. 19
Fig. 20

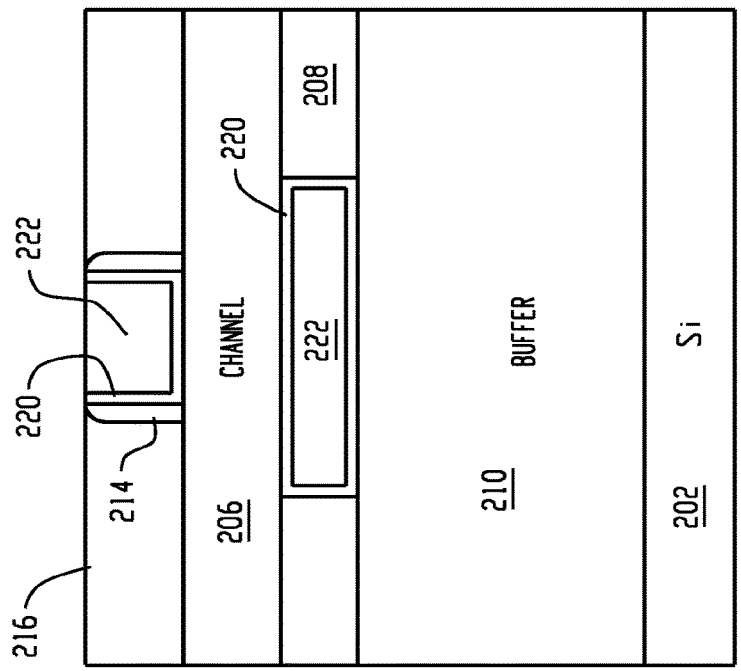
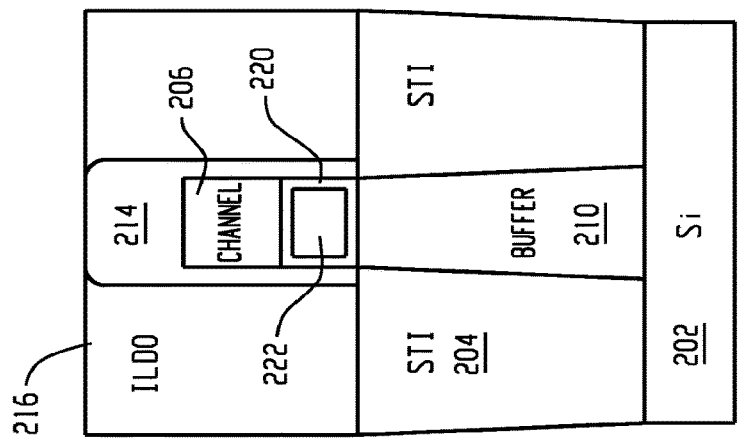
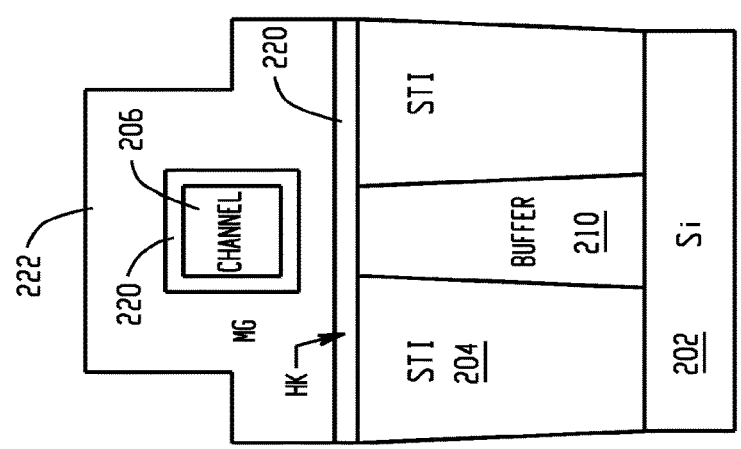
Fig. 28
Fig. 27
Fig. 26

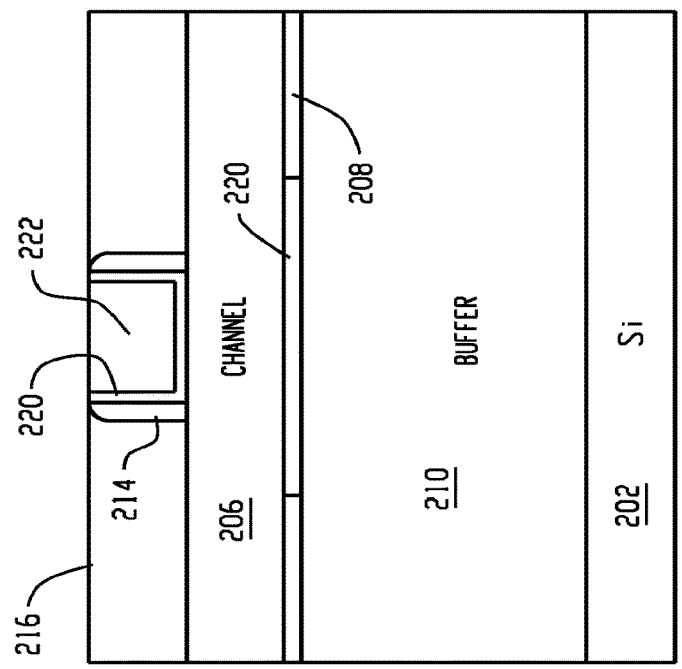
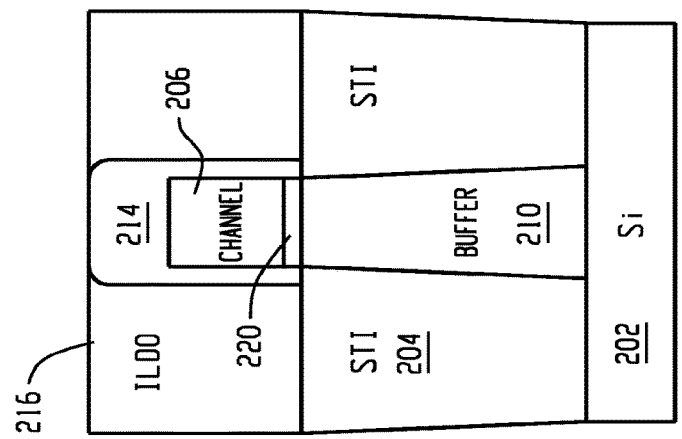
Fig. 30 EXTENSION
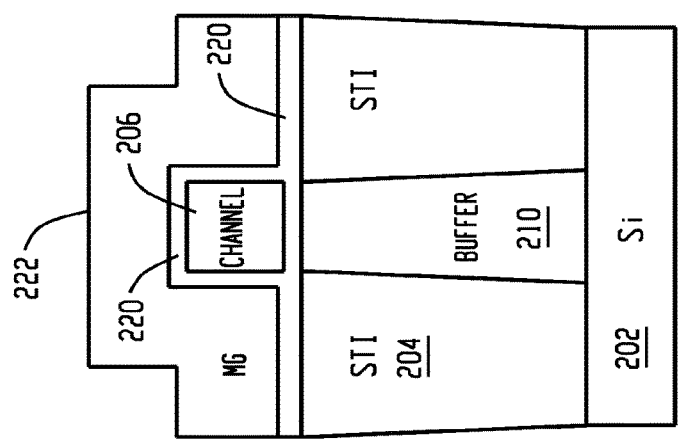
Fig. 29 GATE
Fig. 31

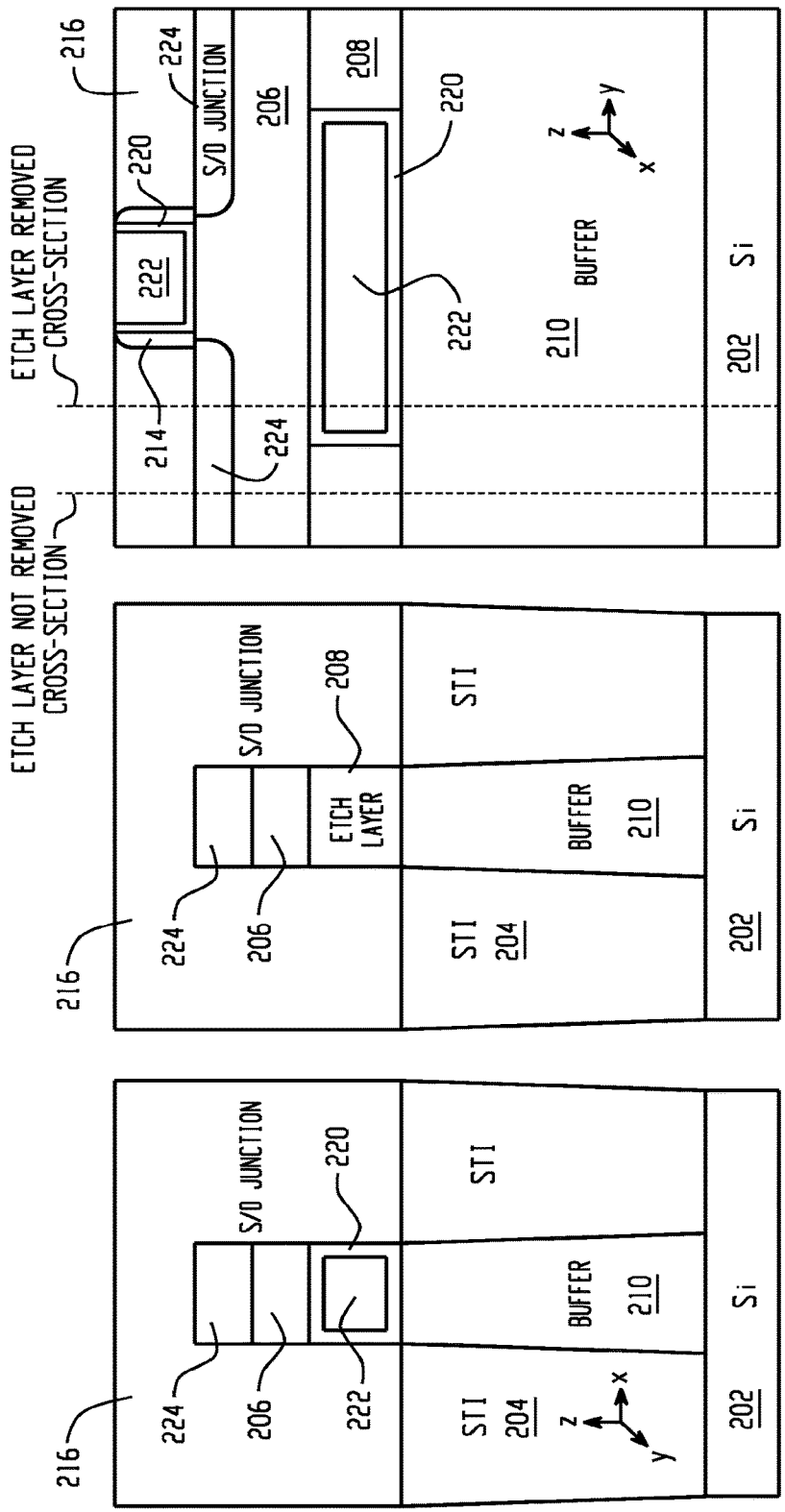

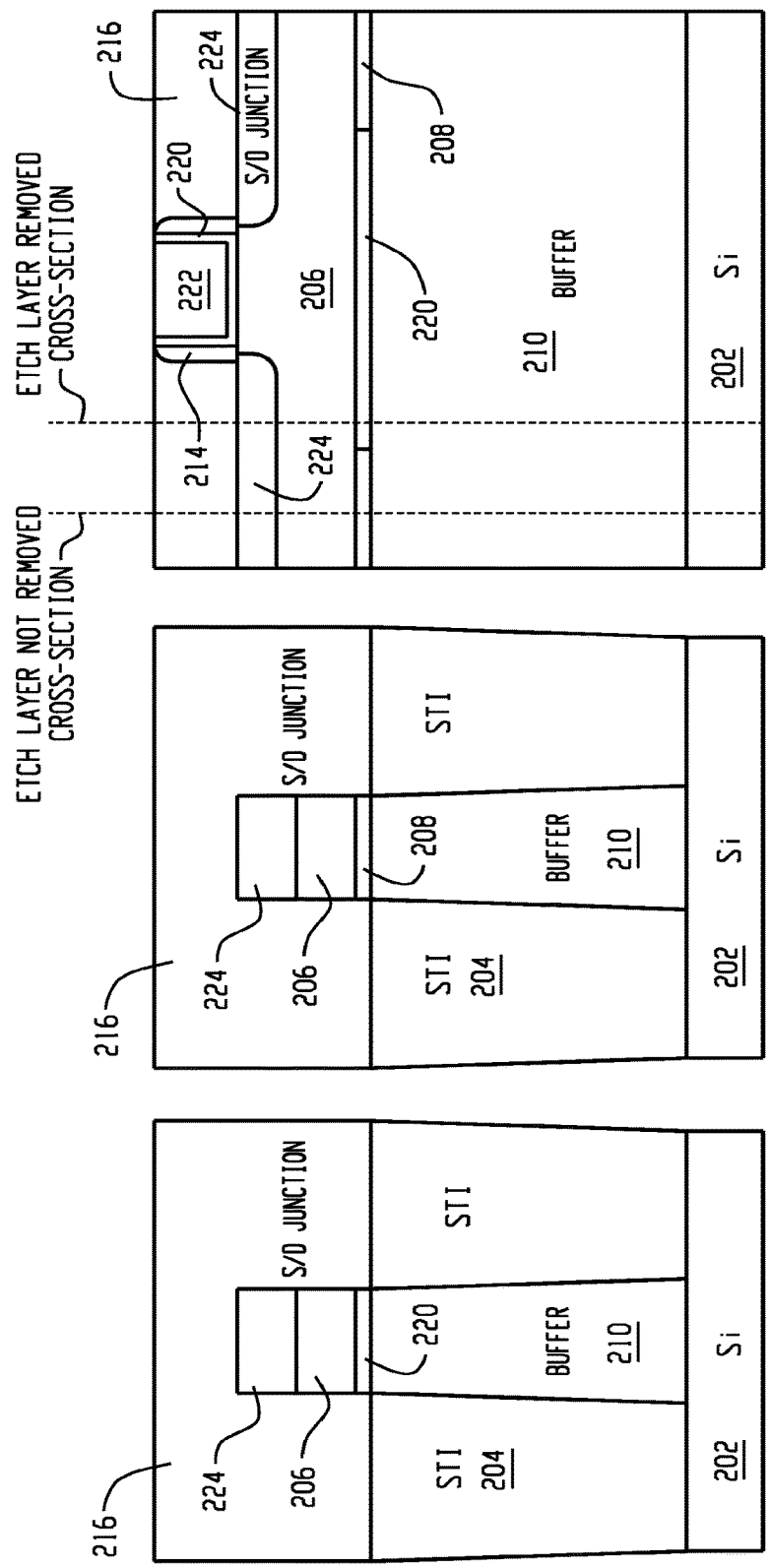

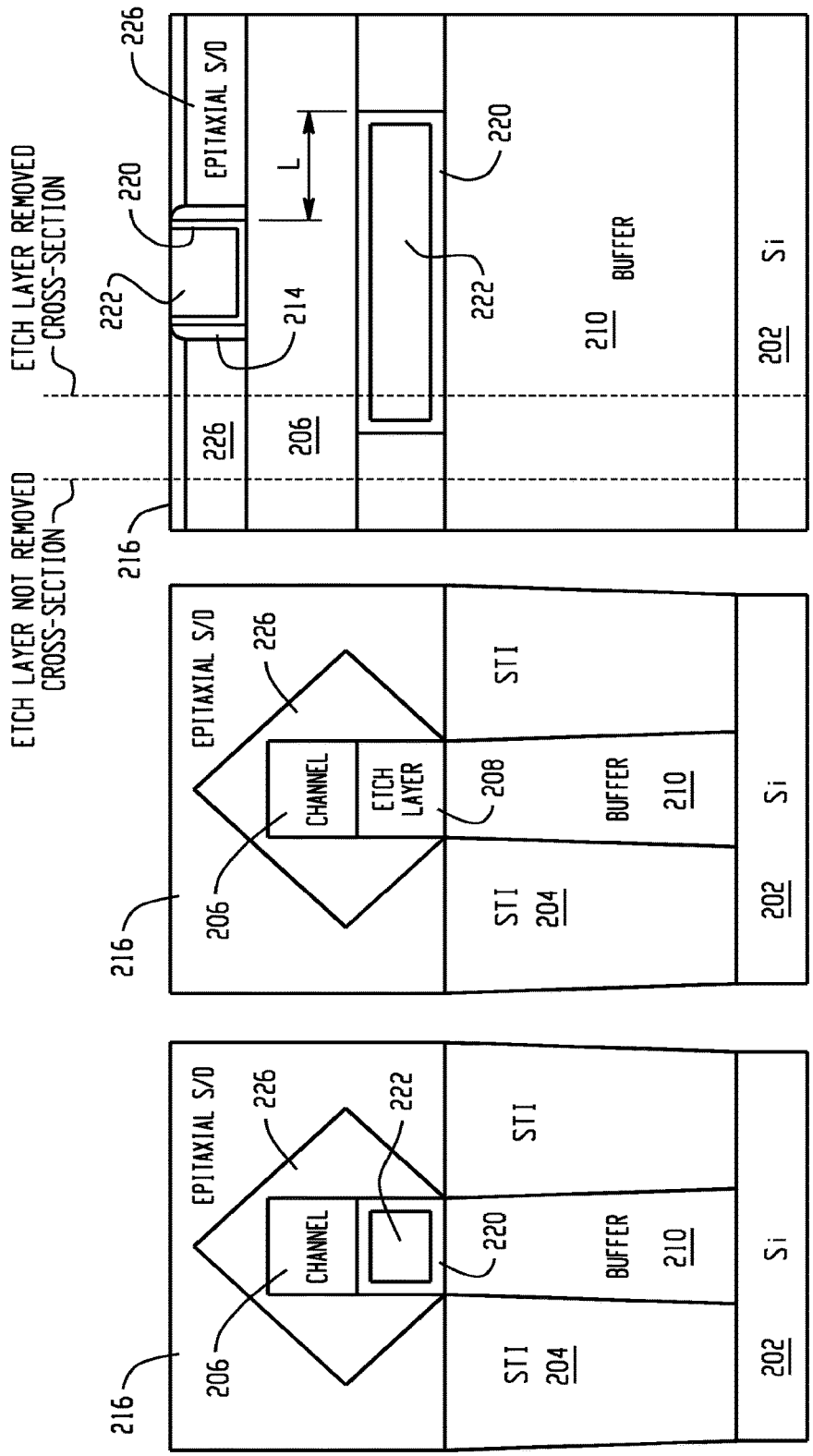

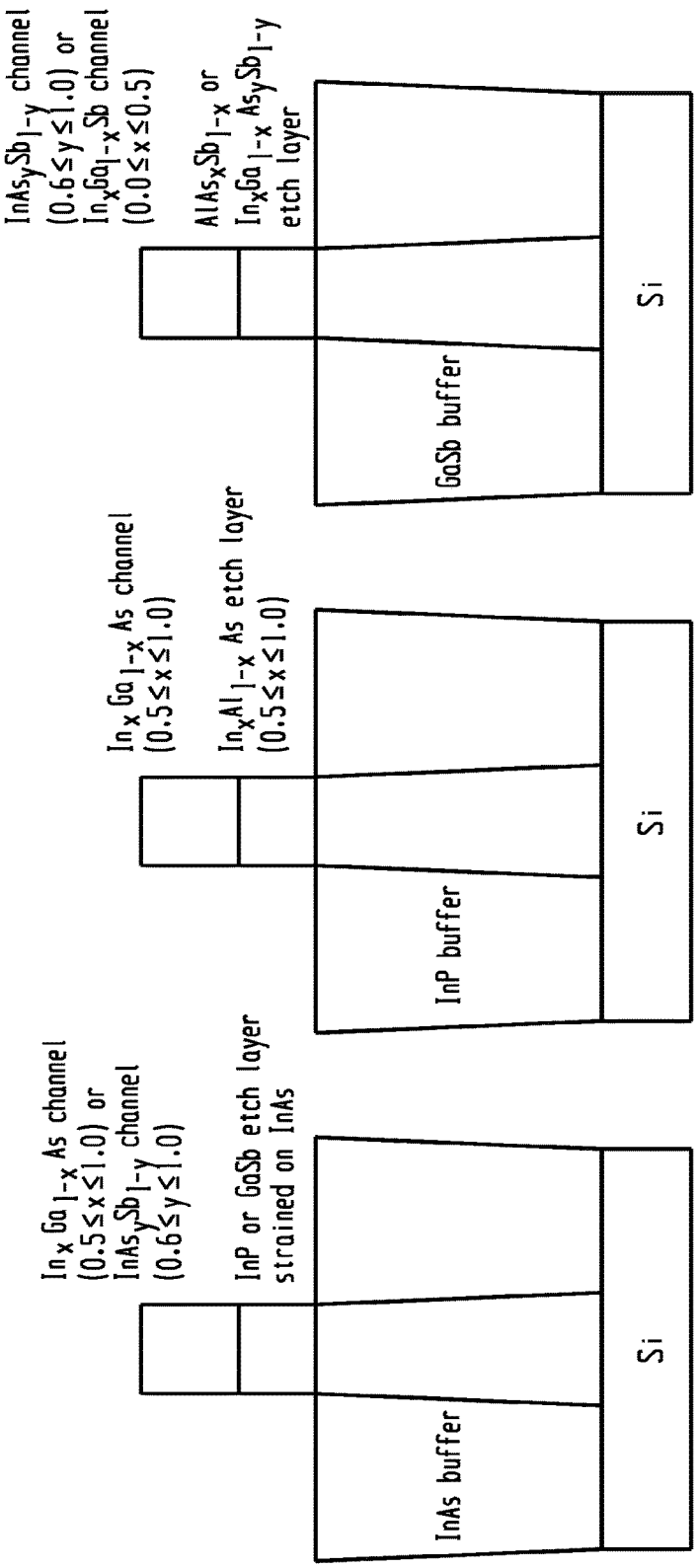

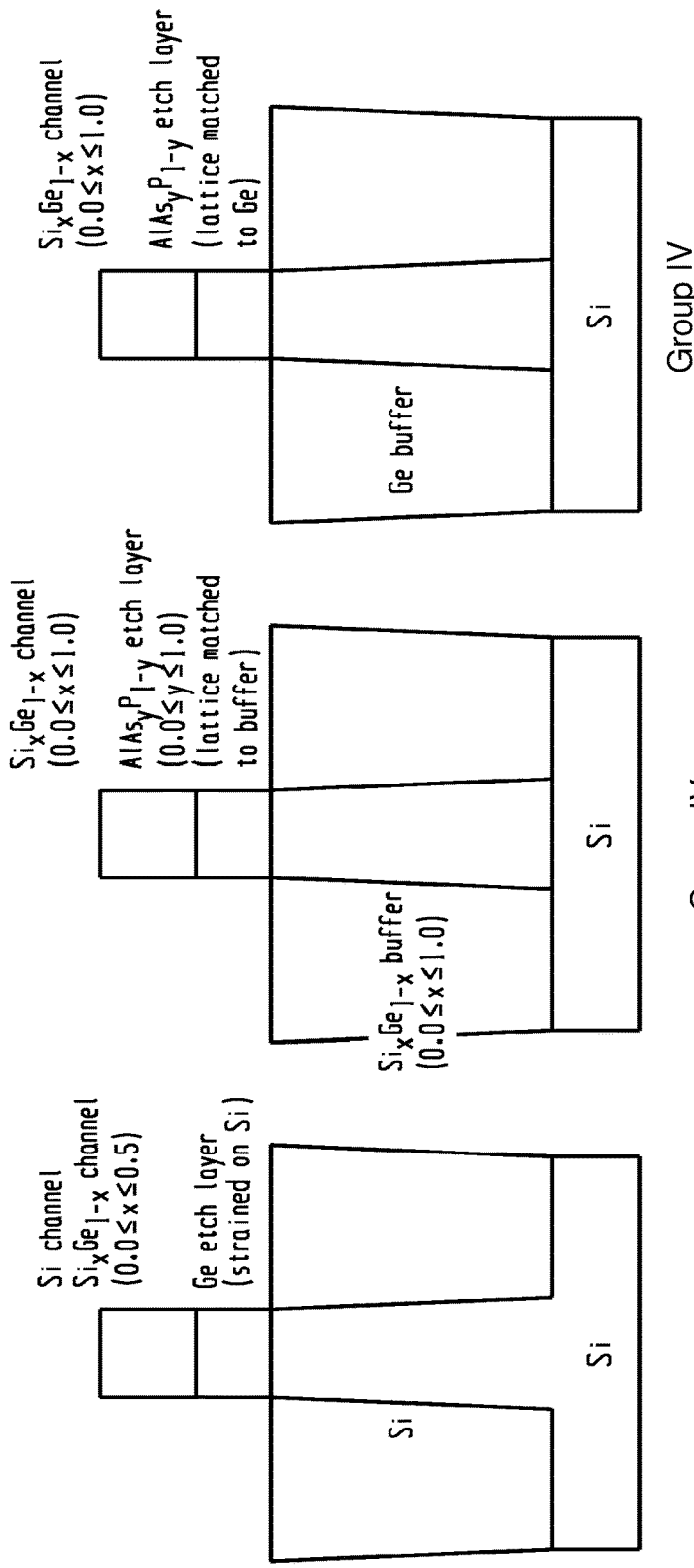

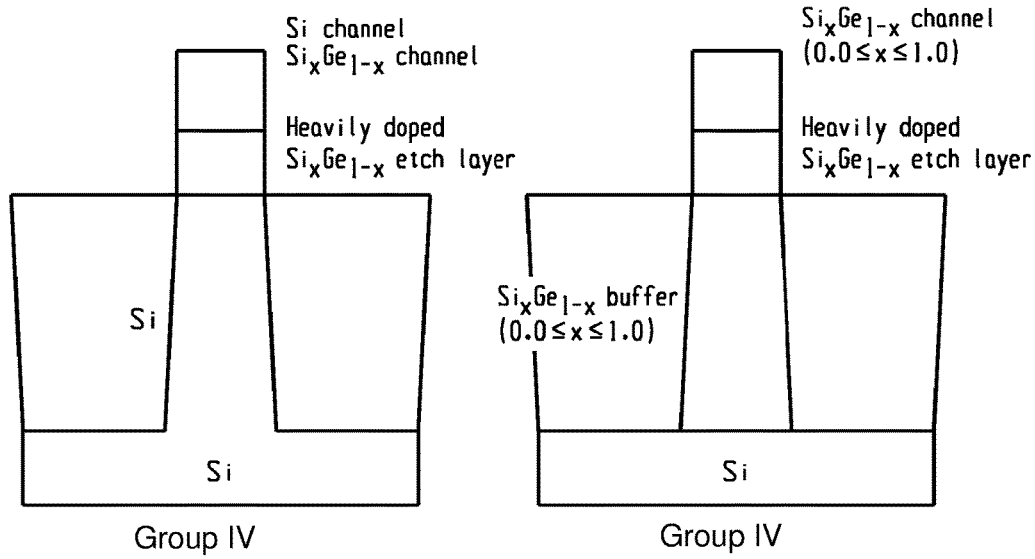
Fig. 50 — Group IV
Fig. 51 — Group IV
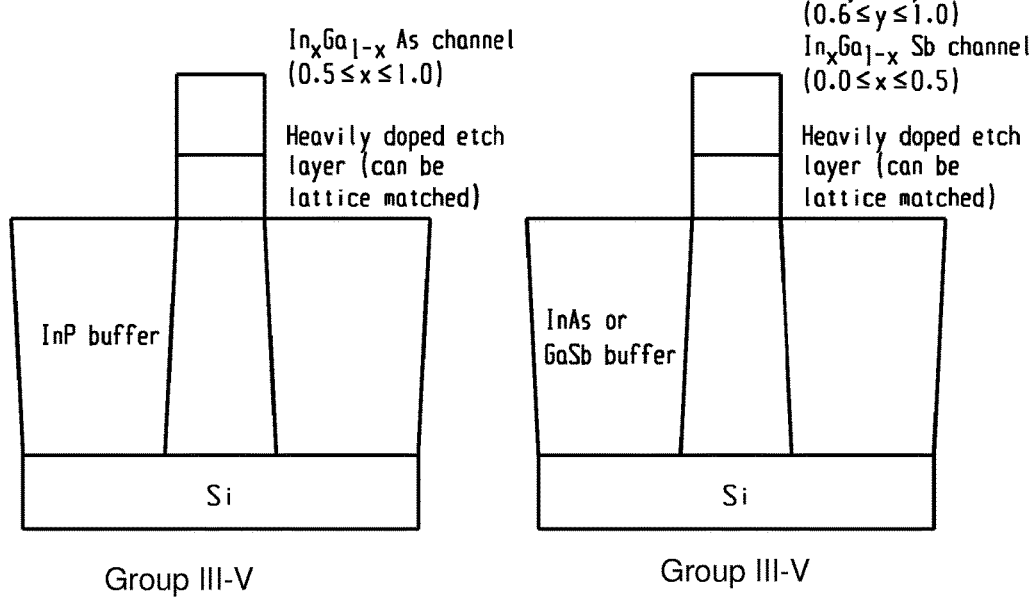
Fig. 52 — Group III-V
Fig. 53 — Group III-V

NANOWIRE FIELD EFFECT TRANSISTOR HAVING A METAL GATE SURROUNDING SEMICONDUCTOR NANOWIRE

CROSS-REFERENCE TO RELATED APPLICATIONS

This application is a continuation of U.S. patent application Ser. No. 15/286,679, filed on Oct. 6, 2016, now U.S. Pat. No. 9,911,599, which is a continuation of U.S. patent application Ser. No. 14/821,884, filed on Aug. 10, 2015, now U.S. Pat. No. 9,472,618, which is a divisional of U.S. patent application Ser. No. 14/101,715, now U.S. Pat. No. 9,136,332, filed Dec. 10, 2013, which are incorporated herein by reference in their entirety.

TECHNICAL FIELD

The technology described in this disclosure relates generally to nanowire-based devices and more particularly to nanowire-based field effect transistors (FETs) and techniques for the fabrication thereof.

BACKGROUND

Gate all around (GAA) nanowire channel field effect transistors (FETs) may enable feature scaling beyond current planar complementary-metal-oxide semiconductor (CMOS) technology. Nanowire channel FETs may also be of interest due to their electrostatics, which may be superior to those of conventional FET devices. The fabrication of nanowire channel FETs may include generating a collection of nanowires and placing them where desired (e.g., a bottom-up approach) or may include various lithographic patterning procedures (e.g., a top-down approach).

BRIEF DESCRIPTION OF THE FIGURES

FIGS. 1A, 1B, and 1C depict example steps that may be used in fabricating a gate all around (GAA), lateral nanowire field effect transistor (FET).

FIGS. 18, 19, and 20 depict an example etching of the etch layer.

FIGS. 26, 27, and 28 depict an example metal gate layer that is deposited over the portion of the nanowire, where the metal gate layer may form a second portion of the replacement gate.

FIGS. 29, 30, and 31 depict an alternative embodiment of the example GAA, lateral nanowire FET structure, where the alternative embodiment may use a thin etch layer to form a tri-gate structure.

FIGS. 32, 33, and 34 depict example source and drain regions of the GAA, lateral nanowire FET.

FIGS. 35, 36, and 37 depict example source and drain regions, where the example source and drain regions may be formed in an alternative embodiment of the GAA, lateral nanowire FET.

FIGS. 38, 39, and 40 depict second example source and drain regions of the GAA, lateral nanowire FET.

FIGS. 44-49 depict example material system options for a GAA, lateral nanowire FET.

FIGS. 50-53 depict additional example material system options for a GAA, lateral nanowire FET.

DETAILED DESCRIPTION

Figure 4:
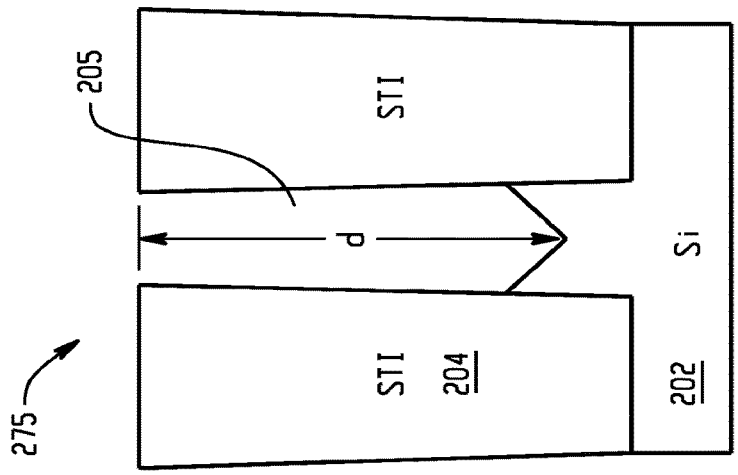
FIGS. 3 and 4 depict an exemplary trench that may be formed by etching the fin structure.

FIGS. 1A, 1B, and 1C depict example steps that may be used in fabricating a gate all around (GAA), lateral nanowire field effect transistor (FET). As illustrated in FIG. 1A at 120, a fin structure may be disposed substantially over a semiconductor substrate 110. The semiconductor substrate may include silicon, SiGe, Ge, or a semiconductor such as InP, InAs, AlAs, AlP, or GaAs. The fin structure may include a buffer layer 108 formed substantially over the semiconductor substrate 110, an etch layer 104 (e.g., a sacrificial layer) formed substantially over the buffer layer 108, and a channel layer 102 formed substantially over the etch layer 104. The layers 102, 104, 108 may be provided via an epitaxial growth process. In an example, the channel layer 102 and/or the etch layer 104 may comprise non-silicon semiconductor materials, such that the buffer layer 108 may be provided to compensate for a lattice mismatch between the semiconductor substrate 110 and the channel layer 102 and/or the etch layer 104 (e.g., in cases where the semiconductor substrate 110 is silicon).

The channel layer 102 may comprise a non-silicon nanowire that is used to provide a channel region of the lateral nanowire FET. For example, FIGS. 1A, 1B, and 1C may depict cross-sectional views of different stages in the fabrication of the lateral nanowire FET, where the cross-sectional views are taken at a gate region of the FET. Thus, a length of the nanowire 102 may extend a distance in the y-direction (i.e., into the page), and source and drain regions of the FET (not depicted in the cross-sectional views of FIGS. 1A, 1B, and 1C) may be connected by the nanowire 102. In the example of FIGS. 1A, 1B, and 1C, the fin structure including the channel layer 102, the etch layer 104, and the buffer layer 108 may be surrounded by shallow trench isolation (STI) material 106. The STI material 106 may include an oxide material or another type of material configured to provide electrical isolation between adjacent fin structures or other structures fabricated over the substrate 110.

At 140 of FIG. 1B, the etch layer 104 may be etched. In an example, the etching may be performed following a removal of a dummy gate structure that is deposited around a portion of the nanowire 102. In this example, the removal of the dummy gate structure may expose the portion of the nanowire 102 and the sacrificial layer 104 thereunder (i.e., a portion of the sacrificial layer 104 that is directly below the portion of the nanowire 102), such that the exposed portion of the etch layer 104 may thereafter be etched. The etching may be selective to the etch layer 104, such that the channel layer 102 is not etched, and the buffer layer 108 is also not etched a significant amount. As illustrated at 140 of FIG. 1B, the etching may cause a portion of the nanowire 102 to be suspended over the semiconductor substrate 110.

At 160 of FIG. 1C, a replacement gate that surrounds the portion of the nanowire 102 may be formed. As described above, the fabrication of the lateral nanowire FET may involve the use of the dummy gate structure, and the replacement gate may be used to replace the dummy gate structure following the removal of the dummy gate structure. The replacement gate may be formed using an example HKMG process (i.e., a high-k dielectric, metal gate process). In the example HKMG process, a first high-k dielectric layer 112 and a metal gate layer 114 may be deposited in a conformal manner over all sides of the nanowire 102, as depicted in FIG. 1C. In an example, the conformal deposition may be provided using an atomic layer deposition (ALD) process. Following the conformal deposition, the nanowire 102 may no longer be suspended over the semiconductor substrate.

FIG. 1C further depicts a second high-k dielectric layer 116 that may be deposited substantially over the STI material 106 and the buffer layer 108. The second high-k dielectric layer 116 may be formed during the deposition of the first high-k dielectric layer 112. For example, in depositing the first high-k dielectric layer 112 to coat the sides of the nanowire 102, high-k dielectric material may also be deposited over the STI material 106 and the buffer layer 108, thus forming the layer 116. As described in further detail below, the second high-k dielectric layer 116 may help to prevent the gate region of the FET from shorting to the buffer layer 108, which may reduce gate leakage current.

In the end-product device structure depicted at 160 of FIG. 1C, the channel region of the lateral nanowire FET, provided by the nanowire 102, may be electrically isolated from the semiconductor substrate 110. The electrical isolation may be a consequence of i) the selective etching of the etch layer 104, which may physically isolate the channel layer 102 from the bulk substrate (i.e., as depicted at 140 of FIG. 1B), and ii) the replacement HKMG process that may provide the gate all around structure, where the gate all around structure may comprise the layers 112, 114, 116 surrounding the channel layer 102 (i.e., as depicted at 160 of FIG. 1C).

As noted above, the channel layer 102 may be a non-silicon semiconductor material that is provided via an epitaxial growth process. The non-silicon semiconductor material used for the channel layer 102 may include, for example, compound group III-V semiconductors, group IV semiconductors, or other materials. Such compound group III-V semiconductors or group IV semiconductors may comprise high mobility channel materials and may be used to replace silicon nanowires used in conventional nanowire FET devices. The replacement of the silicon nanowires with the high mobility semiconductor materials may be complicated by various issues, however. For example, the high mobility channel materials having a different lattice parameter to silicon may be highly defective at the epitaxially formed interface with silicon. Further, implant doping to create an isolation well may not be a simple matter in the group III-V and IV semiconductors, and bulk-like or buffer layers of high mobility semiconductors may be conductive, thus leading to unwanted source-drain leakage currents.

The lateral nanowire field effect transistor (FET) described above with reference to FIGS. 1A, 1B, and 1C may address the issues described above. By growing the epitaxial etch layer 104 under the channel layer 102 and subsequently removing the etch layer 104 via a selective etch technique, the FET may have a high crystalline quality channel material that is electrically isolated from the bulk substrate. The nanowire 102 may be combined with the HKMG process described above to make the GAA finFET structure, and the GAA finFET structure may be compatible with VLSI design rules and various processing requirements (e.g., International Technology Roadmap for Semiconductors (ITRS) specifications). The GAA finFET structure may be used to fabricate group III-V or IV finFET devices with good electrostatic control and low leakage, as described in further detail below. The structure and method described herein may be equally applicable to NMOSFET and PMOSFET technologies.

Figure 2:
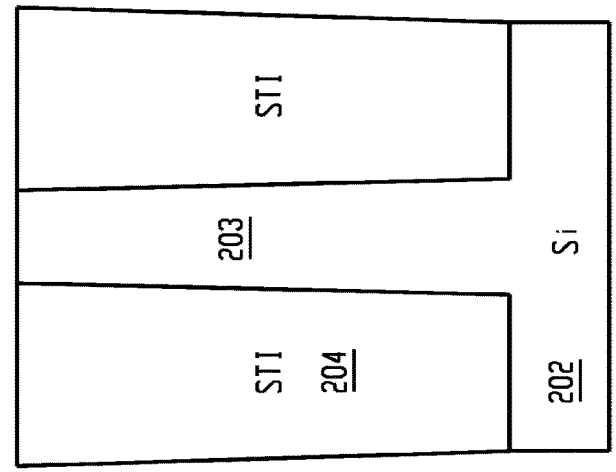
FIG. 2 depicts a patterned semiconductor substrate, where the patterned semiconductor substrate may include a fin structure surrounded by shallow trench isolation (STI) material.

FIGS. 2-31 depict example steps in forming a GAA lateral nanowire FET device. FIG. 2 depicts a patterned semiconductor substrate 202, where the patterned semiconductor substrate 202 may include a fin structure 203. The fin structure 203 may be surrounded by shallow trench isolation (STI) material 204. The STI material 204 may include an oxide material or another type of material configured to provide electrical isolation between adjacent fin structures or other structures fabricated over the substrate 202.

Figure 3:
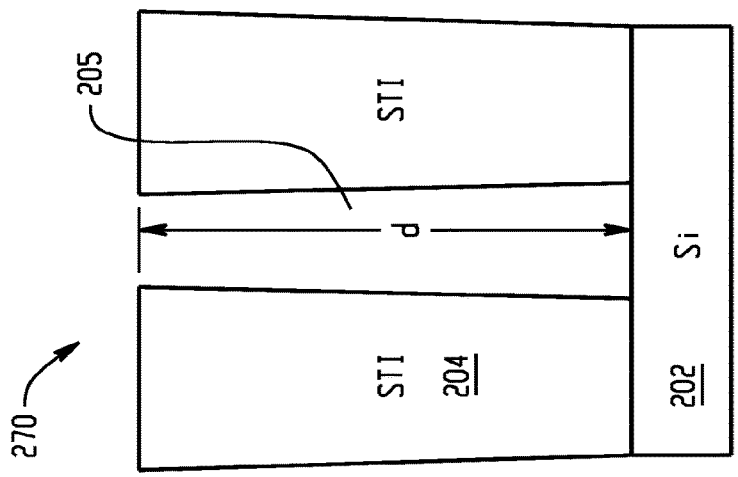

FIGS. 3 and 4 depict an exemplary trench 205 that may be formed by etching the fin structure 203. As illustrated at 270 of FIG. 3, a depth ("d") of the trench 205 may be equal to a thickness of the STI material 204. Alternatively, as illustrated at 275 of FIG. 4, the depth of the trench 205 may comprise only a percentage of the thickness of the STI material 204. For example, the depth of the trench 205 may be equal to one third of the thickness of the STI material 204 or one half of the thickness of the STI material 204. As illustrated in the examples at 270 and 275, a profile of the bottom of the trench 205 may be flat, rounded, or V-shaped, among other geometries.

Figure 5:
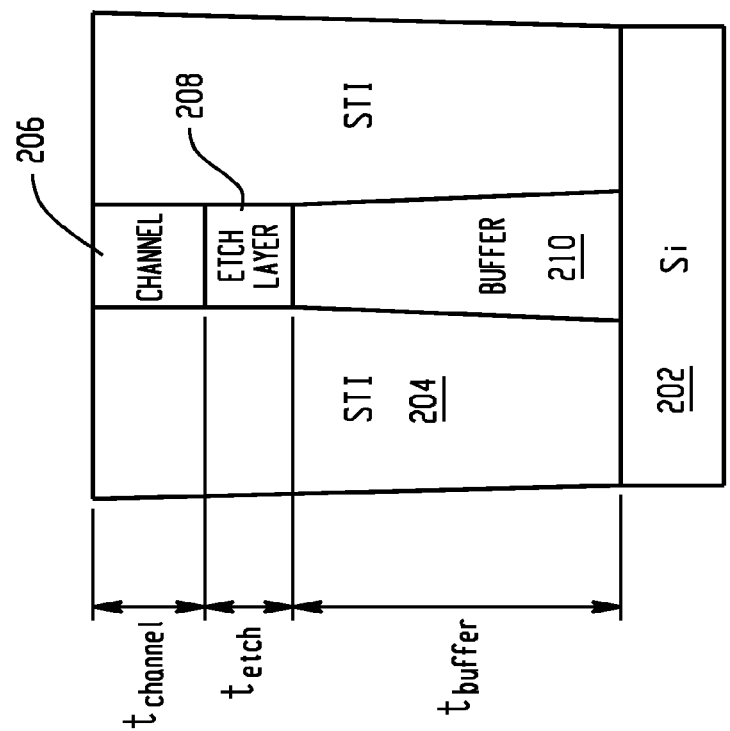
FIG. 5 depicts example epitaxial layers formed substantially over the semi conductor substrate.

FIG. 5 depicts example epitaxial layers 206, 208, 210 formed substantially over the semiconductor substrate 202. The example epitaxial layers may include a channel layer 206, an etch layer 208 (i.e., a sacrificial layer), and a buffer layer 210. The layers 206, 208, 210 may be provided via one or more epitaxial growth processes. The channel layer 206 may include a non-silicon nanowire that is used to provide a channel region of the GAA, lateral nanowire FET. In an example, the etch layer 208 may comprise a non-silicon semiconductor material (e.g., a group III-V semiconductor material), such that the buffer layer 210 may be provided to compensate for a lattice mismatch between the semiconductor substrate 202 and the etch layer 208. The one or more epitaxial processes used to grow the layers 206, 208, 210 may be combined with various other processing techniques (e.g., cleaning processes, recess processes, or chemical mechanical polishing (CMP) processes, etc.) to achieve the structure depicted in FIG. 5.

A thickness of the channel layer 206 (i.e., "$t_{channel}$") may be within a range of approximately 5 nm to 30 nm. A thickness of the etch layer 208 (i.e., "$t_{etch}$") may be within a range of approximately 1 nm to 15 nm. A thickness of the buffer layer 210 (i.e., "$t_{buffer}$") may be within a range of approximately 20 nm to 300 nm. Such thicknesses are exemplary only, and the layers 206, 208, 210 may be fabricated to various other thicknesses. In an example, the thickness $t_{etch}$ may be one to fifteen times smaller than the thickness $t_{channel}$, which may cause the etch layer 208 to comprise a strained layer. The use of a strained layer for the etch layer 208 may increase a number of potential material systems that may be used in fabricating the etch layer 208. Because the etch layer 208 is a sacrificial layer that is removed via an etch process, the increased number of potential material systems may allow a greater etch selectivity to be engineered.

Figure 6:
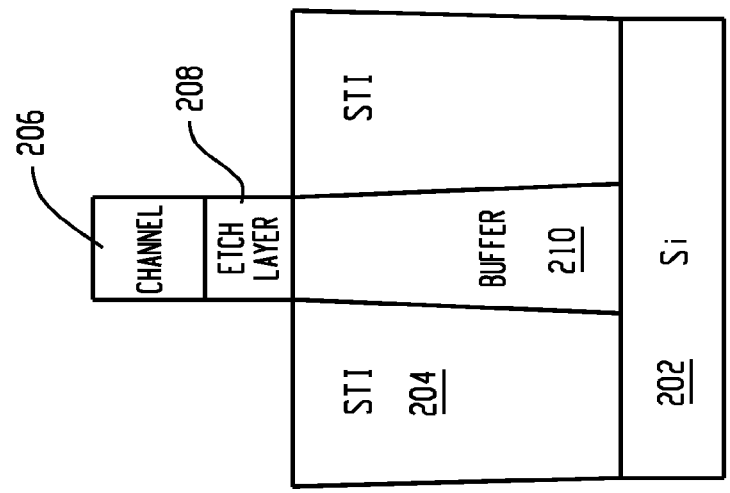
FIG. 6 depicts an example etching of the STI material, where the etching may be used to expose a channel layer and a etch layer.
Figure 8:
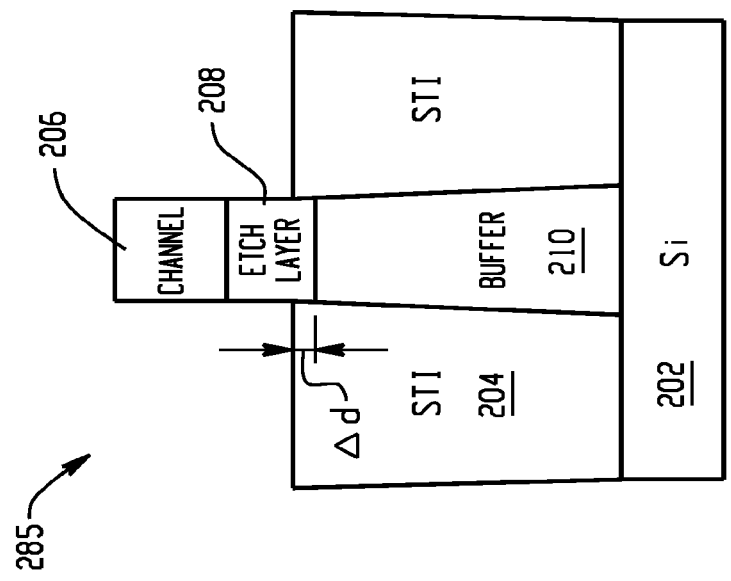
FIGS. 7 and 8 depict additional example structures that may be formed by etching the STI material.
Figure 7:
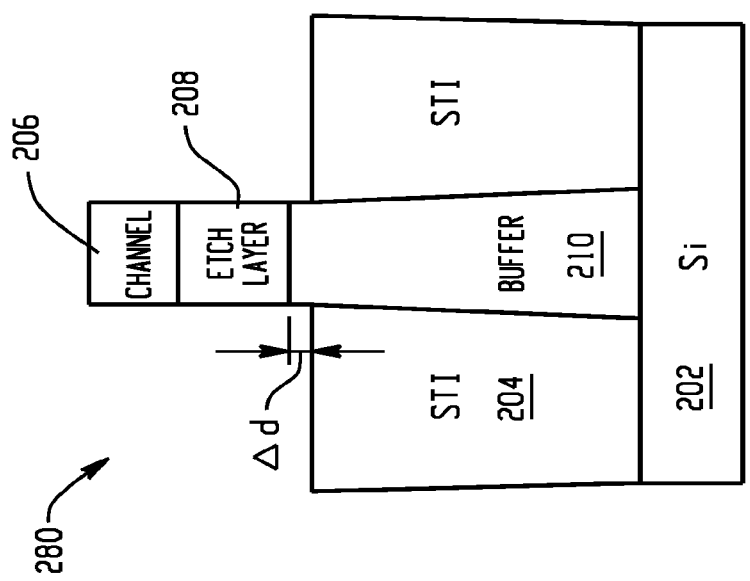

FIG. 6 depicts an example etching of the STI material 204, where the etching may be used to expose the channel layer 206 and the etch layer 208. The STI material 204 may be etched until the etch layer 208 is fully exposed or partially exposed. Further, the STI material 204 may be over-etched or under-etched, as illustrated in FIGS. 7 and 8. In FIG. 7, at 280, the STI material 204 may have been over-etched, such that a thickness Δd of the buffer layer 210 is exposed at a top surface of the STI material 204. In FIG. 8, at 285, the STI material 204 may have been under-etched, such that a thickness Δd of the etch layer 208 is recessed within the STI material 204. Other methods of achieving the structures depicted in FIGS. 6-8 may be used.

Figure 11:
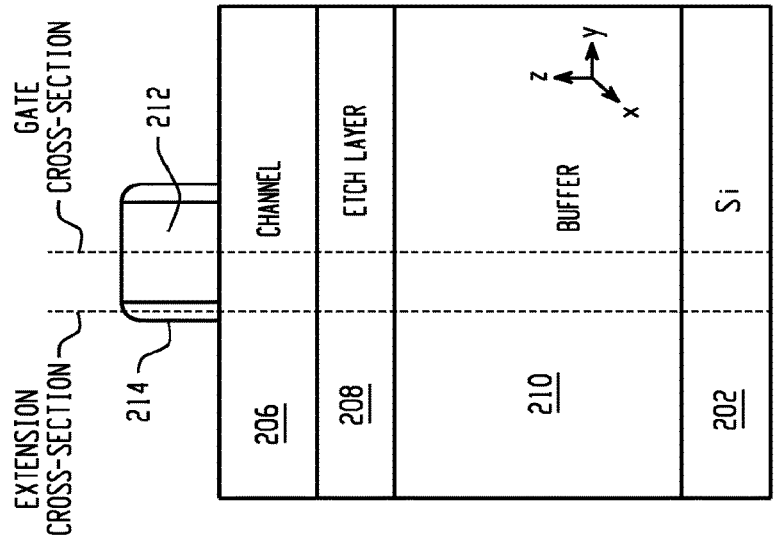
FIGS. 9, 10, and 11 depict the formation of an example dummy gate substantially over the channel layer of the FET, where spacer material may be formed at ends of the example dummy gate.
Figure 10:
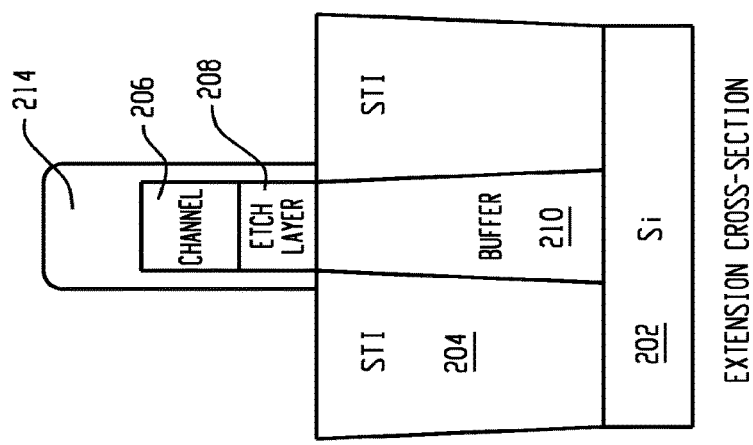
Figure 9:
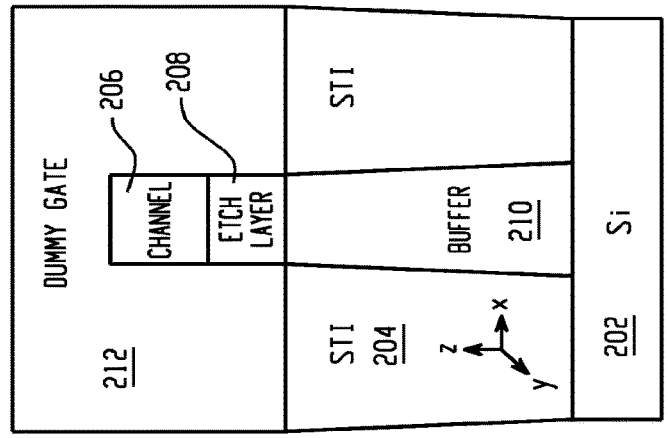

FIGS. 9, 10, and 11 depict the formation of an example dummy gate 212 substantially over the channel layer 206 of the FET, where an extension 214 may be formed at ends of the example dummy gate 212. In FIGS. 9 and 10, a "gate cross-section" and an "extension cross-section" may be depicted, respectively. Cut-lines illustrating a location of the gate cross-section and the extension cross-section may be illustrated in FIG. 11, which illustrates the structure rotated by 90 degrees (e.g., as evidenced by the x/y/z axes depicted in the different portions of FIGS. 9 and 11). In the gate cross-section, the dummy gate 212 may be formed substantially over the channel layer 206 and the etch layer 208, such that the dummy gate 212 surrounds three sides of the channel layer 206 and two sides of the etch layer 208. The portion of the channel layer 206 over which the dummy gate 212 is formed may comprise a nanowire channel region of the lateral nanowire FET, where the nanowire channel region connects source and drain regions of the FET.

In the extension cross-section, the extension 214 may be formed substantially over the channel layer 206 and the etch layer 208, such that the extension 214 surrounds three sides of the channel layer 206 and two sides of the etch layer 208. The extension 214 may comprise a spacer material, and the spacer material may be, for example, a nitride spacer, an oxide spacer, or another type of spacer material. The spacer material may be used to maintain integrity of the gate region or other portions of the semiconductor structure throughout the fabrication process (e.g., to reduce interaction with aggressive chemicals that may be used in further processing). Following the formation of the dummy gate 212 and the extension 214, source and drain regions of the FET may be formed. In the interest of clarity, the source and drain regions may not be depicted in FIGS. 9-31. Reference is made to FIGS. 32-34, described in further detail below, which may depict exemplary source and drain regions.

Figure 14:
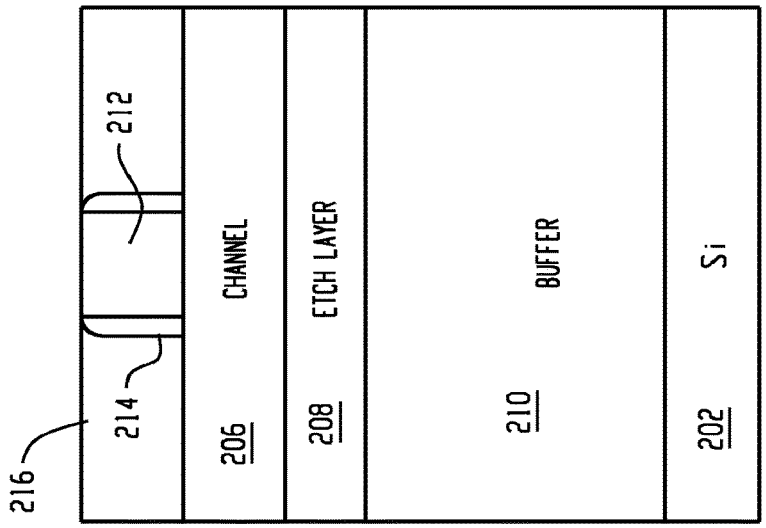
FIGS. 12, 13, and 14 depict an interlayer dielectric (ILD) layer that may be formed substantially over the FET structure.
Figure 13:
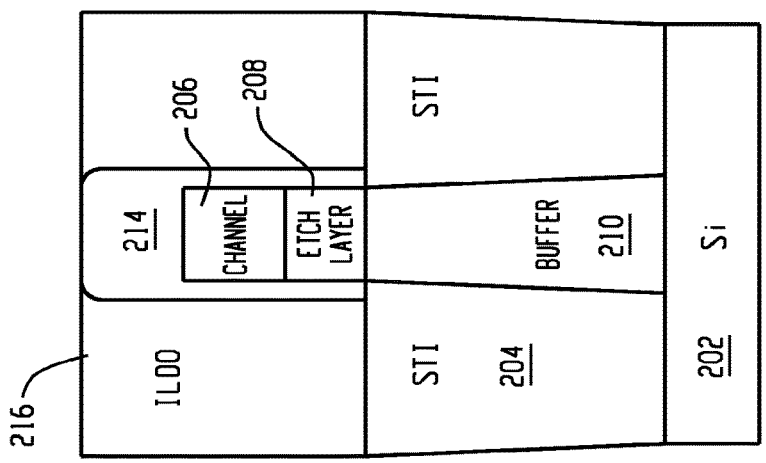
Figure 12:
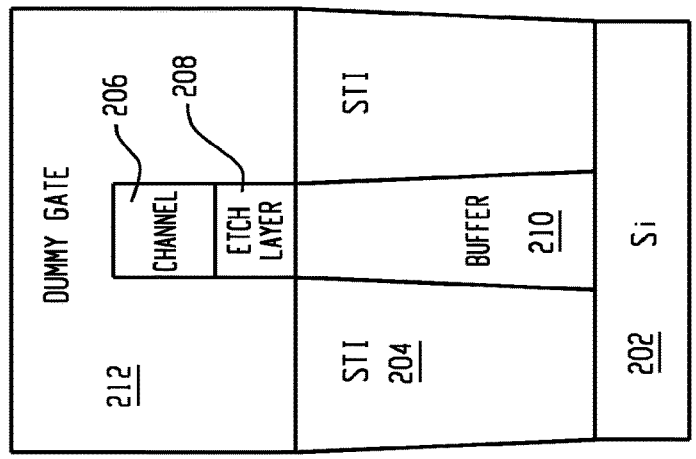

Similar to FIGS. 9-11, FIGS. 12-31 may depict a gate cross-sectional view, an extension cross-sectional view, and a third view of the structure that is rotated by 90 degrees (i.e., where the gate cross-sectional view, the extension cross-sectional view, and the third view are ordered as such from left to right). FIGS. 12, 13, and 14 depict an interlayer dielectric (ILD) layer 216 that may be formed substantially over the FET structure. In FIGS. 12, 13, and 14, the ILD layer 216 may be formed over portions of the channel layer 206 that are not covered by the dummy gate 212 or the extension 214.

Figure 17:
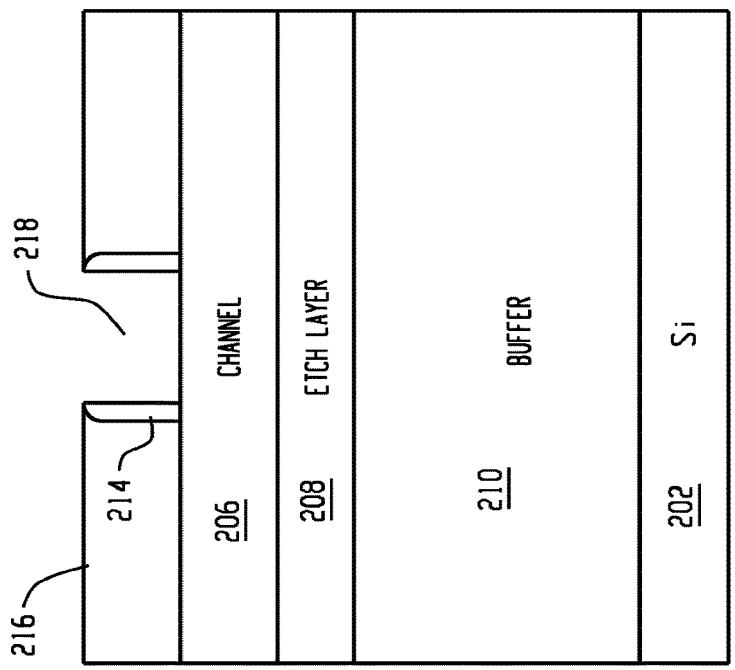
FIGS. 15, 16, and 17 depict a removal of the example dummy gate.
Figure 16:
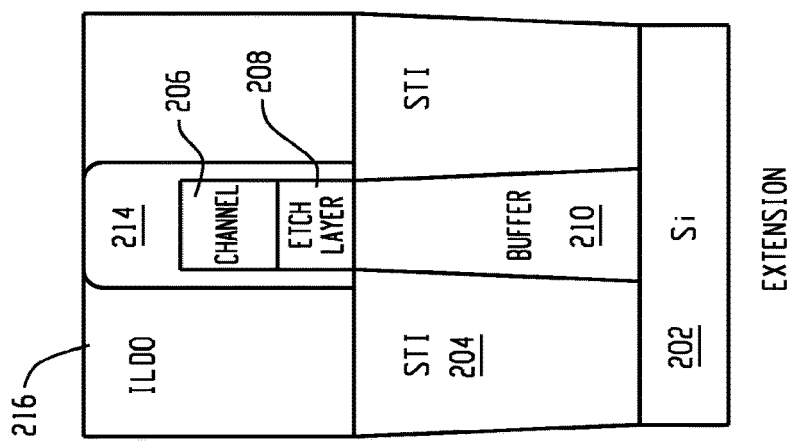
Figure 15:
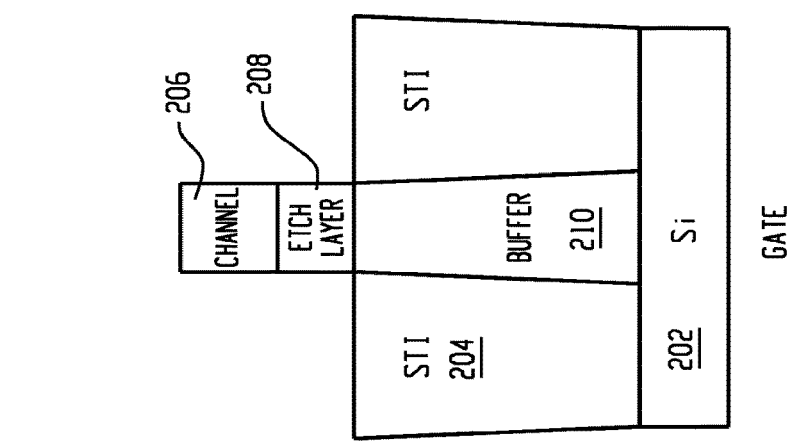

FIGS. 15, 16, and 17 depict a removal of the example dummy gate 212. As depicted in FIGS. 15, 16, and 17, the removal of the example dummy gate 212 may create an opening 218 (e.g., an etch window), and the opening 218 may expose a portion of the channel layer 206 and a portion of the etch layer 208.

FIGS. 18, 19, and 20 depict an example etching of the etch layer 208. In etching the etch layer 208, the opening 218 formed by the removal of the dummy gate 212 may expose the portion of the etch layer 208 to an etchant, thus facilitating the etching. A wet etchant (i.e., an aqueous etchant) or a dry etchant (e.g., a reactive ion etch (RIE) etchant) may be used to selectively remove the etch layer 208 without removing the channel layer 206. Example wet etchants that may be used include HCl, $C_6H_8O_7$, and $NH_4OH$, among others. Example dry etchants that may be used include HCl, $SiCl_4$, $SF_6$, $BCl_3$, or $Cl_2$, among others. The selectivity of the etching may also enable the buffer layer 210 to not be substantially etched, or the buffer layer 210 may be partially removed by the etching. Thus, the etchant may have a property that enables a high etch rate for the etch layer 208 and a low etch rate for the channel layer 206 and the buffer layer 210.

As illustrated in FIGS. 18, 19, and 20, the etching causes the portion of the nanowire 206 to be suspended over the semiconductor substrate 202. The portion of the nanowire 206 that is suspended may comprise the channel region of the GAA, lateral nanowire FET. The suspended nanowire 206 may be anchored at each end by the extension 214 (i.e., the spacer material) and the ILD layer 216.

The etching of the etch layer 208 may be understood as including multiple aspects. In a first aspect of the etching, a first portion of the etch layer 208 may be etched, where the first portion may comprise the portion of the etch layer 208 that is directly exposed to the etchant via the opening 218. In a second aspect of the etching, a second portion of the etch layer 208 may be etched, where the second portion may comprise a portion of the etch layer 208 that is removed via etch undercutting. The portion of the etch layer 208 that may be removed via the etch undercutting may be characterized by a distance L, as depicted in FIGS. 18, 19, and 20. The etch undercutting may occur under the source and drain regions of the FET (not depicted in FIGS. 18, 19, and 20), and the distance L may be the distance over which the etch undercutting extends beneath the source or drain region. The portion of the etch layer 208 that is removed via the etch undercutting may not be directly exposed to the etchant.

Figure 22:
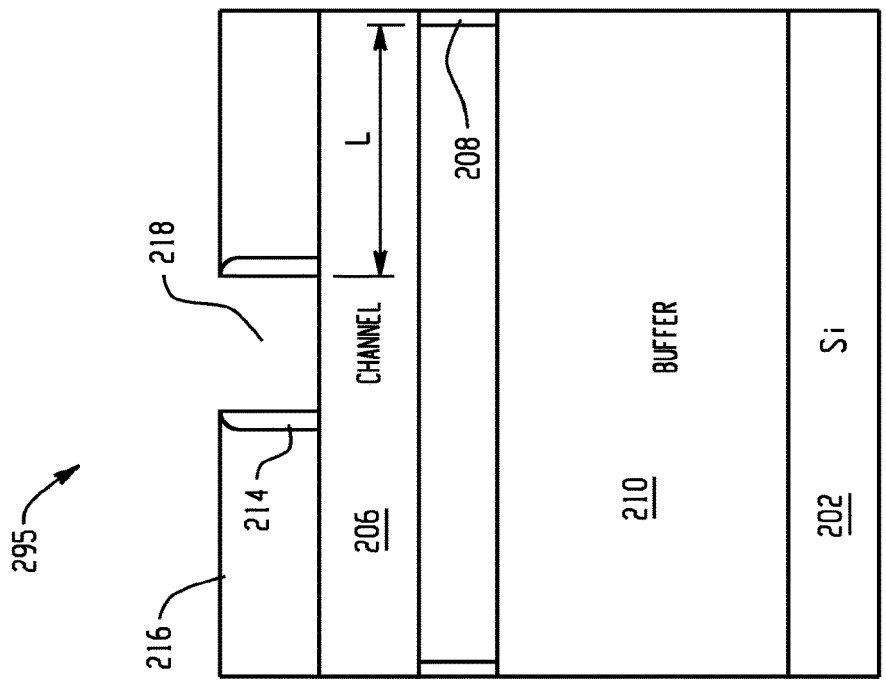
FIGS. 21 and 22 depict further aspects of the example etching of the etch layer, where an etch time is varied to control an amount of etch undercutting beneath source and drain regions of the FET.
Figure 21:
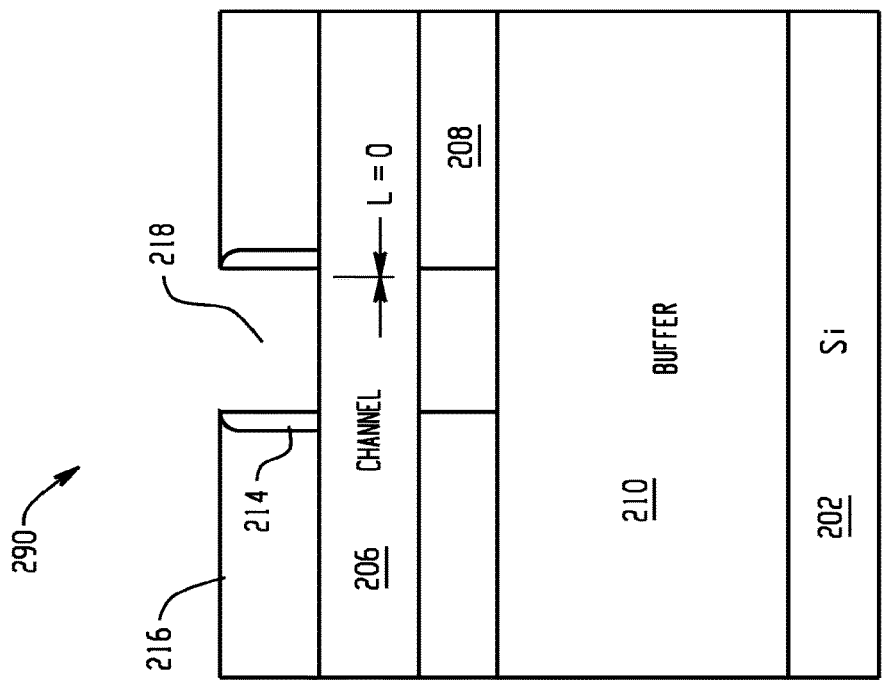

FIGS. 21 and 22 depict further aspects of the example etching of the etch layer 208, where an etch time is varied to control an amount of etch undercutting beneath the source and drain regions of the FET. In FIGS. 18-22, the distance L over which the etch undercutting extends beneath the source or drain region may be determined based on an amount of time used in etching the etch layer 208. By varying the etch time, the undercut length L may be varied to achieve a desired effect, with limiting cases being L=0 (i.e., no etch undercutting beneath the source and drain regions, as depicted in FIG. 21 at 290) and L=$L_{S/D}$, where $L_{S/D}$ may be equal to a length of the source or drain region of the FET (i.e., as depicted in FIG. 22 at 295). A minimization of processing time may be desired, and to achieve this desired effect, the etch time may be engineered to cause L=0. Alternatively, it may be desirable to minimize source-to-drain leakage by removing semiconductor material that connects the source and drain regions, and to achieve this desired effect, the etch time may be engineered to cause L=$L_{S/D}$. In controlling the source-to-drain leakage based on the distance L, the distance L may determine a degree to which areas of the source or drain region are electrically isolated from the buffer layer 210, or the distance L may determine a potential barrier between the source/drain region and the buffer layer, which is higher than an operation voltage of the FET. In the embodiment to achieve this desired effect, the etch time may be engineered to cause 0≤L≤Lchannel, where Lchannel is the channel length. And in another embodiment to achieve this desired effect, the etch time may be engineered to cause Lchannel≤L≤$L_{S/D}$.

Figure 25:
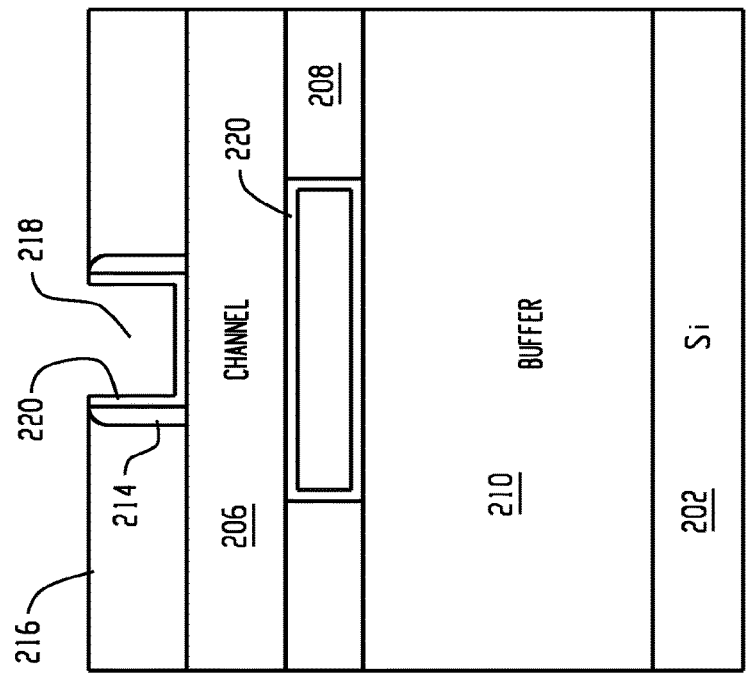
FIGS. 23, 24, and 25 depict an example high-k dielectric layer that is deposited over a portion of the nanowire, where the high-k dielectric layer may form a first portion of a replacement gate.
Figure 24:
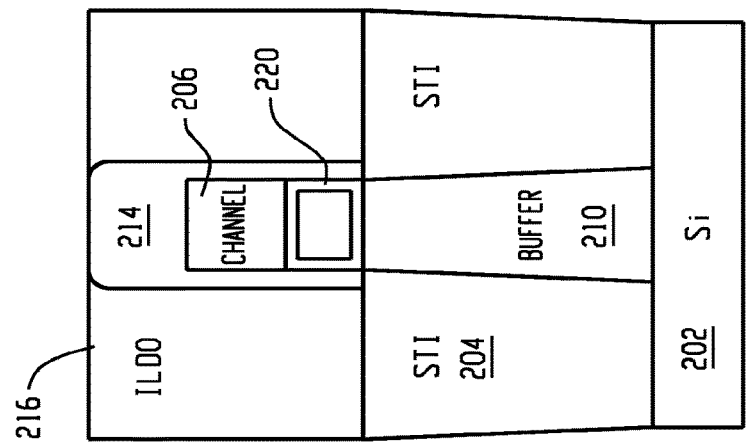
Figure 23:
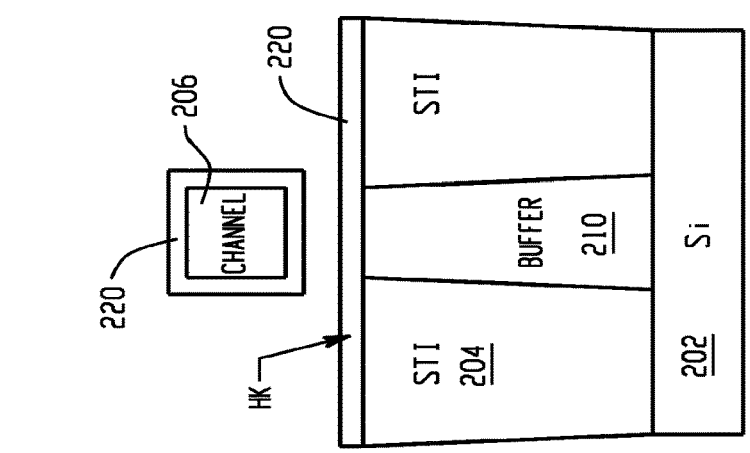

FIGS. 23, 24, and 25 depict an example high-k dielectric layer 220 that is deposited over a portion of the nanowire, where the high-k dielectric layer 220 may form a first portion of a replacement gate. The high-k dielectric layer 220 may be deposited in a conformal manner, such that the high-k dielectric layer 220 may surround all sides of the nanowire 206. The conformal deposition may be achieved using an atomic layer deposition (ALD) process. The high-k dielectric layer 220 may be $Al_2O_3$, $HfO_2$, $La_2O_3$, or $ZrO_2$, among others. A process temperature used in the deposition of the high-k dielectric layer 220 may be within a range of approximately 100-300 degrees Celsius.

As illustrated in FIGS. 23, 24, and 25, the conformal deposition may further cause the high-k dielectric layer 220 to be formed over the STI material 204, the buffer layer 210, and on sidewalls of the etched portion of the etch layer 208. The high-k dielectric layer 220 that is deposited on the buffer layer 210 and the sidewalls of the etched portion of the etch layer 208 may prevent a gate region of the FET from shorting i) to source and drain regions of the FET, and/or ii) to the buffer layer 210. The high-k dielectric layer 220 deposited in these areas may thus be configured to reduce gate leakage.

FIGS. 26, 27, and 28 depict an example metal gate layer 222 that is deposited over the portion of the nanowire, where the metal gate layer 222 may form a second portion of the replacement gate. The metal gate layer 222 may be deposited in a conformal manner, such that the metal gate layer 222 may surround all sides of the nanowire 206. As illustrated in FIGS. 26, 27, and 28, following the deposition of the metal gate layer 222, the nanowire 206 may no longer be suspended over the semiconductor substrate 202. The conformal deposition may be achieved using an ALD process. As illustrated in FIGS. 26, 27, and 28, the conformal deposition may further cause the metal gate layer 222 to be deposited in the cavity that is formed in the etch layer 208. The metal gate layer 222 may include TiN, TaN, Pd, or Pt, among others. The structure depicted in FIGS. 26, 27, and 28 may be an example end product device structure for a first embodiment of the example GAA, lateral nanowire FET structure described herein.

FIGS. 29, 30, and 31 depict a second embodiment of the example GAA, lateral nanowire FET structure, where the second embodiment may use a thin etch layer 208 to form a tri-gate structure. The structure depicted in FIGS. 29, 30, and 31 may be an example end product device structure for the second embodiment. In FIGS. 29, 30, and 31, the etch layer 208 may have a thickness that is less than twice the thickness of the high-k dielectric layer 220. Using the thin etch layer 208, a gap between the channel layer 206 and the buffer layer 210 may be closed during the deposition of the high-k dielectric layer 220, such that the metal gate layer 222 may not be able to completely surround the nanowire 206. In this example, the device may utilize the tri-gate structure, where the channel region of the channel layer 206 is isolated from the bulk (e.g., the buffer layer 210) by the high-k dielectric layer 220. In another embodiment, a ratio of the thickness of the high-k dielectric layer to the thickness of a diameter of the nanowire determined by the channel region of the channel layer is between about ⅓ and 1, such that it may be desirable to minimize source-to-drain leakage by removing semiconductor material that connects the source and drain regions. In controlling the source-to-drain leakage based on the ratio, the ratio may determine a potential barrier between the source/drain region and the buffer layer higher than an operation voltage of the FET.

FIGS. 32, 33, and 34 depict example source/drain regions 224 of the GAA, lateral nanowire FET. FIGS. 32-43 include layers similar to those described above, with reference to FIGS. 2-31, and reference numbers for the similar layers are carried over from the earlier figures. The similar layers included in FIGS. 32-43 are not described in further detail herein, and reference is made to the descriptions for FIGS. 2-31 above. In FIGS. 32, 33, and 34, the source/drain regions 224 may be described as "source/drain junctions," as illustrated in the figures. The source/drain regions 224 may be formed in the channel layer 206, and the source/drain regions 224 may be (a) ion implanted, (b) metal-semiconductor compounds, (c) a combinations of (a) and (b), or (d) both of (a) and (b). The source/drain regions 224 may be formed after the deposition of the spacer material 214 in the replacement gate flow process. FIGS. 35, 36, and 37 may be similar to FIGS. 32, 33, and 34 and may depict the formation of the source/drain junctions 224 in the second embodiment of the example GAA, lateral nanowire FET structure (e.g., the second embodiment described above with reference to FIGS. 29-31).

In a left-most portion of FIGS. 32 and 33, an "etch layer removed" cross-section and an "etch layer not removed" cross-section may be depicted, respectively. Cut-lines illustrating the locations of these cross-sections may be illustrated in FIG. 34, which illustrates the structure rotated by 90 degrees (e.g., as evidenced by the x/y/z axes depicted in the different portions of FIGS. 32 and 34). At the "etch layer removed" cross-section, the source/drain region 224 may be electrically isolated from the buffer layer 210. By contrast, at the "etch layer not removed" cross-section, the source/drain region 224 may not be isolated from the buffer layer 210. As described above, a distance L over which the etch undercutting extends beneath the source/drain regions 224 may be determined based on an amount of time used in etching the etch layer 208. The distance L may thus determine a degree to which areas of the source/drain regions 224 are electrically isolated from the buffer layer 210. Further, an amount of leakage current between the source region and the drain region that flows through the buffer layer 210 may be determined based on the distance L.

Figure 43:
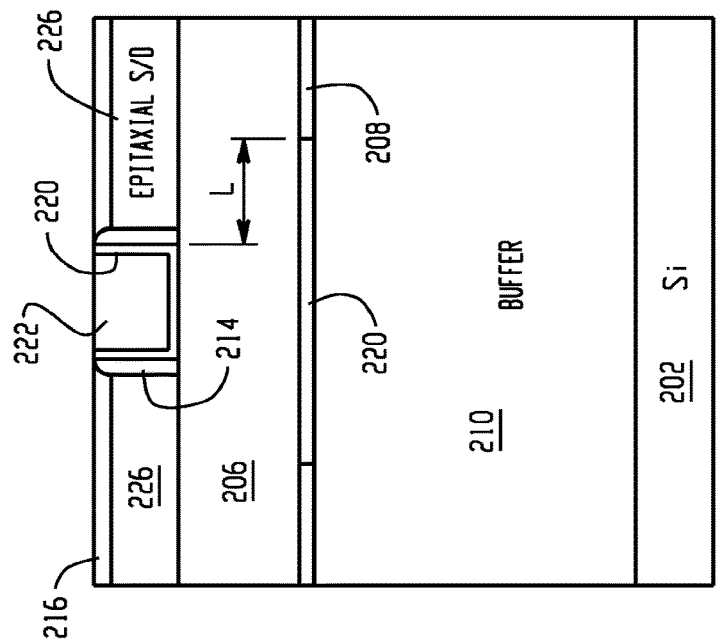
FIGS. 41, 42, and 43 depict second example source and drain regions, where the second example source and drain regions may be formed in an alternative embodiment of the GAA, lateral nanowire FET.
Figure 42:
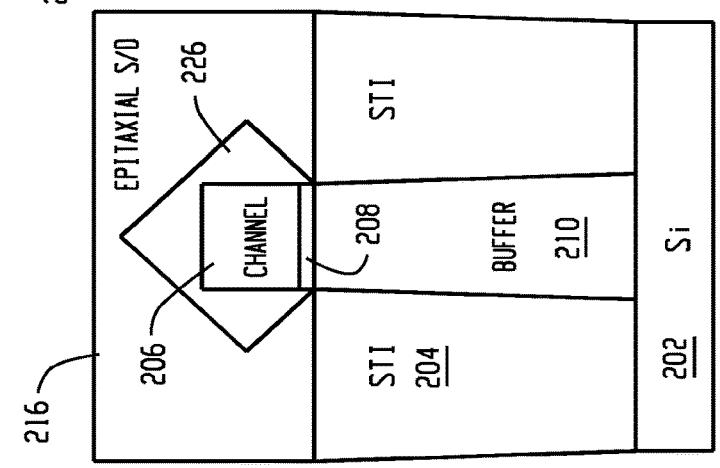
Figure 41:
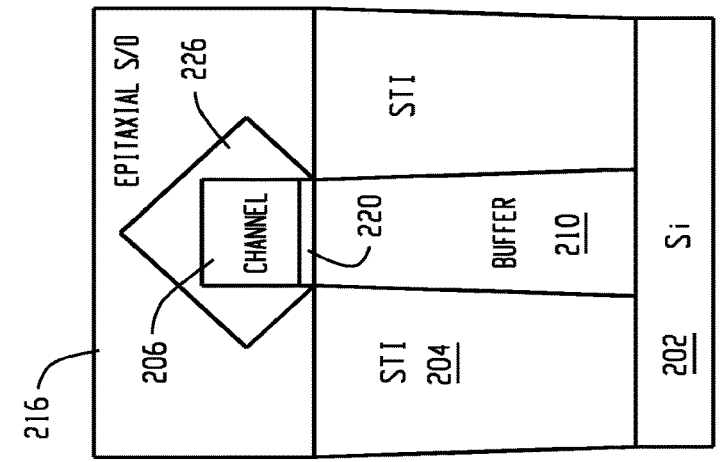

FIGS. 38-40 may be similar to FIGS. 32-34 and FIGS. 41-43 may be similar to FIGS. 35-37. In FIGS. 38-40, second example source/drain regions 226 of the FET are formed. The second source/drain regions 226 may be formed via an epitaxial process that occurs after the deposition of the spacer material 214. FIGS. 41-43 may be similar to FIGS. 38-40 and may depict the formation of the second source/drain regions 226 in the second embodiment of the example GAA, lateral nanowire FET structure (e.g., the second embodiment described above with reference to FIGS. 29, 30, and 31). In an example, the epitaxial source/drain regions 226 may be combined with the source/drain junctions 224 of FIGS. 32-37.

FIGS. 44-49 depict example material system options for a GAA, lateral nanowire FET. Group III-V semiconductor material system options for the buffer layer may include InAs, InP, or GaSb. Group III-V semiconductor material system options for the etch layer may include InP or GaSb (e.g., strained on InAs), $In_xAl_{1-x}As$ ($0.5 \leq x \leq 1.0$), $AlAs_xSb_{1-x}$, or $In_xGa_{1-x}As_ySb_{1-y}$. Group III-V semiconductor material system options for the channel layer may include $In_xGa_{1-x}As$ ($0.5 \leq x \leq 1.0$), $InAs_ySb_{1-y}$ ($0.6 \leq y \leq 1.0$), or $In_xGa_{1-x}Sb$ ($0.0 \leq x \leq 0.5$).

Group IV semiconductor material system options for the buffer layer may include Si, $Si_xGe_{1-x}$ ($0.0 \leq x \leq 1.0$), or Ge. Group IV semiconductor material system options for the etch layer may include Ge (e.g., Ge strained on Si). Further, an $AlAs_yP_{1-y}$ ($0.0 \leq y \leq 1.0$, optionally lattice matched to the buffer) etch layer that is grown between group IV layers may be used. Group IV semiconductor material system options for the channel layer may include Si, $Si_xGe_{1-x}$ ($0.0 \leq x \leq 0.5$), or $Si_{1-x}Ge_{1-x}$ ($0.0 \leq x \leq 1.0$).

FIGS. 50-53 depict additional example material system options for a GAA, lateral nanowire FET. Specifically, FIGS. 50-53 may illustrate the use of dopant selective etching (DSE). In DSE, the nanowire and the etch layer may both comprise a same material. The nanowire may have a first doping level that is different than a second doping level of the etch layer. In one example, the etch layer may be doped more heavily than the nanowire. The DSE process may be used to selectively remove the etch layer based on the differences in the doping levels between the nanowire and the etch layer. DSE may similarly be used to achieve etch selectivity between the etch layer and the buffer layer.

As illustrated in FIGS. 50-53, for Group IV semiconductor materials, the buffer layer may be Si, the etch layer may be $Si_xGe_{1-x}$ that is heavily doped, and the channel layer may be Si or $Si_xGe_{1-x}$. Alternatively, for Group IV semiconductor materials, the buffer layer may be $Si_xGe_{1-x}$ ($0.0 \leq x \leq 1.0$), the etch layer may be $Si_xGe_{1-x}$ that is heavily doped, and the channel layer may be $Si_xGe_{1-x}$ ($0.0 \leq x \leq 1.0$). For Group III-V semiconductor materials, the buffer layer may be InP, the etch layer may be a heavily doped $In_xGa_{1-x}As$ layer that may be lattice matched to the buffer layer, and the channel layer may be $In_xGa_{1-x}As$ ($0.5 \leq x \leq 1.0$). Alternatively, for Group III-V semiconductor materials, the buffer layer may be InAs or GaSb, the etch layer may be a heavily doped $InAs_ySb_{1-y}$ or $In_xGa_{1-x}Sb$ layer that may be lattice matched to the buffer layer, and the channel layer may be $InAs_ySb_{1-y}$ ($0.6 \leq y \leq 1.0$) or $In_xGa_{1-x}Sb$ ($0.0 \leq x \leq 0.5$).

Figure 54:
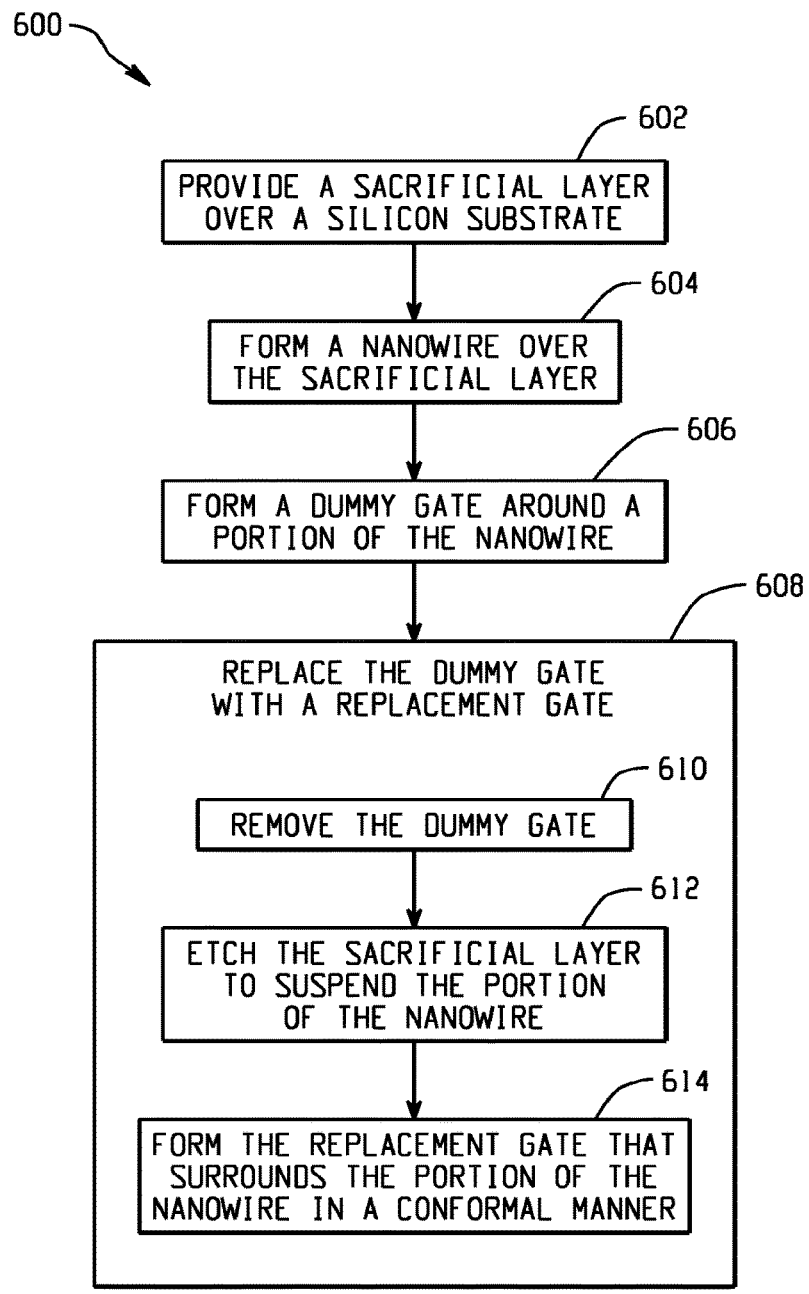
FIG. 54 is a flowchart illustrating an example method for forming a nanowire field effect transistor (FET) device.

FIG. 54 is a flowchart 600 illustrating an example method for forming a nanowire field effect transistor (FET) device. At 602, a sacrificial layer is provided over a semiconductor substrate. At 604, a nanowire is formed over the sacrificial layer via an epitaxial process. At 606, a dummy gate is formed around a portion of the nanowire, where the portion of the nanowire comprises a channel region of a lateral nanowire FET. The channel region connects source and drain regions of the FET. At 608, the dummy gate is replaced with a replacement gate. At 610, the replacing includes removing the dummy gate to expose the portion and the sacrificial layer thereunder. At 612, the replacing includes etching the sacrificial layer after the removal of the dummy gate. The etching is selective to the sacrificial layer to prevent the removal of the nanowire, and the etching causes the portion of the nanowire to be suspended over the semiconductor substrate. At 614, the replacing includes forming the replacement gate that surrounds the portion of the nanowire. The replacement gate is deposited in a conformal manner over all sides of the portion, such that the portion is no longer suspended over the semiconductor substrate.

Accordingly, one aspect of the instant disclosure provides a device, which comprises: a substrate; a buffer layer above the substrate; a nanowire above the buffer layer and including a pair of source/drain regions and a channel region between the source/drain regions; a gate structure surrounding the channel region; and a remnant of a sacrificial layer between the buffer layer and the nanowire and including a group III-V semiconductor material.

Accordingly, another aspect of the instant disclosure provides a method, which comprises: providing a device including a substrate, a buffer layer above the substrate, a nanowire above the buffer layer, and a sacrificial layer between the buffer layer and the nanowire; and removing the sacrificial layer beneath a source/drain region of the nanowire.

Accordingly, yet another aspect of the instant disclosure provides a device, which comprises: a substrate; a buffer layer above the substrate; a nanowire above the buffer layer and including a pair of source/drain regions and a channel region between the source/drain regions; a gate structure surrounding the channel region; and a remnant of a sacrificial layer between the buffer layer and the nanowire and including a group IV semiconductor material.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

The invention claimed is:
1. A semiconductor device, comprising:
a semiconductor substrate;
a semiconductor buffer layer disposed over the semiconductor substrate;
an isolation insulating layer surrounding the buffer layer;
a semiconductor nanowire disposed above the buffer layer and having a source region, a drain region and a channel region between the source region and the drain region;
a gate dielectric layer surrounding the semiconductor nanowire; and a gate electrode layer disposed over the gate dielectric layer and surrounding the semiconductor nanowire, wherein at a bottom of the semiconductor nanowire, the gate dielectric layer and the gate electrode layer laterally extend below the source region and the drain region of the semiconductor nanowire.

2. The semiconductor device of claim 1, further comprising a source epitaxial layer disposed over the source region and a drain epitaxial layer disposed over the drain region.

3. The semiconductor device of claim 1, further comprising an additional layer disposed between the semiconductor buffer layer and the semiconductor nanowire.

4. The semiconductor device of claim 3, wherein at the bottom of the semiconductor nanowire, the gate dielectric layer and the gate electrode layer are disposed between a first part of the additional layer and a second part of the additional layer.

5. The semiconductor device of claim 4, wherein:
the bottom of the semiconductor nanowire, the buffer layer, the first part of the additional layer and the second part of the additional layer from a cavity, and
the gate dielectric layer is disposed on inner surfaces of the cavity and the gate electrode fills the cavity.

6. The semiconductor device of claim 3, further comprising a source epitaxial layer disposed over the source region and a drain epitaxial layer disposed over the drain region.

7. The semiconductor device of claim 6, wherein the source epitaxial layer and the drain epitaxial layer cover side surfaces of the additional layer.

8. The semiconductor device of claim 3, wherein the semiconductor buffer layer is made of one selected from the group consisting of InAs, InP and GaSb.

9. The semiconductor device of claim 8, wherein the additional layer is made of a different material than the semiconductor buffer layer and the semiconductor nanowire, and is made of one selected from the group consisting of includes InP, GaSb, $In_xAl_{1-x}As$, $AlAs_xSb_{1-x}$ and $In_xGa_{1-x}As_ySb_{1-y}$.

10. The semiconductor device of claim 3, wherein the semiconductor buffer layer and the semiconductor nanowire are made of Si, and the additional layer is made of silicon germanium.

11. A semiconductor device, comprising:
a semiconductor substrate;
a semiconductor buffer layer disposed over the semiconductor substrate;
an isolation insulating layer surrounding the buffer layer;
a semiconductor nanowire disposed above the buffer layer and having a source region, a drain region and a channel region between the source region and the drain region;

a gate dielectric layer surrounding the semiconductor nanowire; and a gate electrode layer disposed over the gate dielectric layer and surrounding the semiconductor nanowire, wherein at a bottom of the semiconductor nanowire, the gate dielectric laterally extends below the source region and the drain region of the semiconductor nanowire.

12. The semiconductor device of claim 11, further comprising an additional layer disposed between the semiconductor buffer layer and the semiconductor nanowire.

13. The semiconductor device of claim 12, wherein at the bottom of the semiconductor nanowire, the gate dielectric layer is disposed between a first part of the additional layer and a second part of the additional layer.

14. The semiconductor device of claim 13, wherein:
the bottom of the semiconductor nanowire, the buffer layer, the first part of the additional layer and the second part of the additional layer form a cavity, and
the gate electrode is not disposed in the cavity.

15. The semiconductor device of claim 12, further comprising a source epitaxial layer disposed over the source region and a drain epitaxial layer disposed over the drain region.

16. The semiconductor device of claim 15, wherein the source epitaxial layer and the drain epitaxial layer cover side surfaces of the additional layer.

17. A semiconductor device, comprising:
a semiconductor substrate;
a semiconductor fin structure disposed over the semiconductor substrate;
an isolation insulating layer surrounding the semiconductor fin structure;
a semiconductor nanowire disposed above the semiconductor fin structure and having a source region, a drain region and a channel region between the source region and the drain region;
a gate dielectric layer surrounding the semiconductor nanowire; and
a gate electrode layer disposed over the gate dielectric layer and surrounding the semiconductor nanowire,
wherein at a bottom of the semiconductor nanowire, the gate dielectric layer laterally extends below the source region and the drain region of the semiconductor nanowire.

18. The semiconductor device of claim 17, wherein at the bottom of the semiconductor nanowire, the gate electrode layer laterally extends below the source region and the drain region of the semiconductor nanowire.

19. The semiconductor device of claim 17, further comprising an additional layer disposed between the semiconductor fin structure and the semiconductor nanowire.

* * * * *